US011817861B2

United States Patent
Kim et al.

(10) Patent No.: US 11,817,861 B2
(45) Date of Patent: Nov. 14, 2023

(54) RECEIVER INCLUDING OFFSET COMPENSATION CIRCUIT

(71) Applicant: Samsung Electronics Co., Ltd., Suwon-si (KR)

(72) Inventors: Jueon Kim, Seoul (KR); Taehyoung Kim, Singapore (SG); Seungjin Park, Suwon-si (KR); Jihwan Hyun, Hwaseong-si (KR); Myoungbo Kwak, Seoul (KR); Junghwan Choi, Hwaseong-si (KR)

(73) Assignees: SAMSUNG ELECTRONICS CO., LTD., Suwon-si (KR); NANYANG TECHNOLOGICAL UNIVERSITY, Singapore (SG)

(*) Notice: Subject to any disclaimer, the term of this patent is extended or adjusted under 35 U.S.C. 154(b) by 0 days.

(21) Appl. No.: 17/898,631

(22) Filed: Aug. 30, 2022

(65) Prior Publication Data
US 2023/0170887 A1 Jun. 1, 2023

(30) Foreign Application Priority Data

Nov. 29, 2021 (KR) .................. 10-2021-0167272
Apr. 5, 2022 (KR) .................. 10-2022-0042072

(51) Int. Cl.
| H03K 5/00 | (2006.01) |
| H03K 5/01 | (2006.01) |
| H03K 5/003 | (2006.01) |
| H03K 5/24 | (2006.01) |
| H03K 5/05 | (2006.01) |

(52) U.S. Cl.
CPC ............... *H03K 5/01* (2013.01); *H03K 5/003* (2013.01); *H03K 5/05* (2013.01); *H03K 5/24* (2013.01)

(58) Field of Classification Search
CPC ............ H03K 5/01; H03K 5/003; H03K 5/05; H03K 5/24
See application file for complete search history.

(56) References Cited

U.S. PATENT DOCUMENTS

| 6,275,541 B1 | 8/2001 | Nagahori et al. |
| 6,674,328 B2 | 1/2004 | Uto et al. |
| 7,570,715 B2 | 8/2009 | Mizunaga et al. |

(Continued)

FOREIGN PATENT DOCUMENTS

KR  1020080028656 A  4/2008

*Primary Examiner* — Tuan T Lam
(74) *Attorney, Agent, or Firm* — Muir Patent Law, PLLC

(57) ABSTRACT

A receiver includes a differential signal generator receiving a single-ended signal, and generating differential signals having a positive signal and a negative signal based on the single-ended signal, a reference signal, and a pair of compensation signals, a pair of charging circuits charging first and second nodes to a power level in a logic low period of a clock signal, a pair of discharging circuits discharging the first and second nodes according to a level of the positive signal and a level of the negative signal, respectively, in a logic high period of the clock signal, a comparator comparing signal levels of the first and second nodes and outputting an offset detection signal of the differential signals, and an offset compensator outputting the reference signal and the pair of compensation signals, each adjusted based on the offset detection signal, to the differential signal generator.

20 Claims, 22 Drawing Sheets

(56) References Cited

U.S. PATENT DOCUMENTS

| | | |
|---|---|---|
| 8,295,408 B2 | 10/2012 | Ushio et al. |
| 8,497,739 B2 | 7/2013 | Koyama |
| 8,750,406 B2 | 6/2014 | Pan et al. |
| 9,030,262 B2 | 5/2015 | Cho et al. |
| 9,794,096 B2 * | 10/2017 | Bogdan ................ H03L 7/0807 |
| 10,355,655 B2 | 7/2019 | Nallani et al. |
| 10,878,858 B2 | 12/2020 | Matsuno et al. |
| 2014/0159807 A1 | 6/2014 | Sun et al. |
| 2020/0274741 A1 | 8/2020 | Kang |
| 2023/0045744 A1 * | 2/2023 | Jung .................. G11C 11/4076 |

* cited by examiner

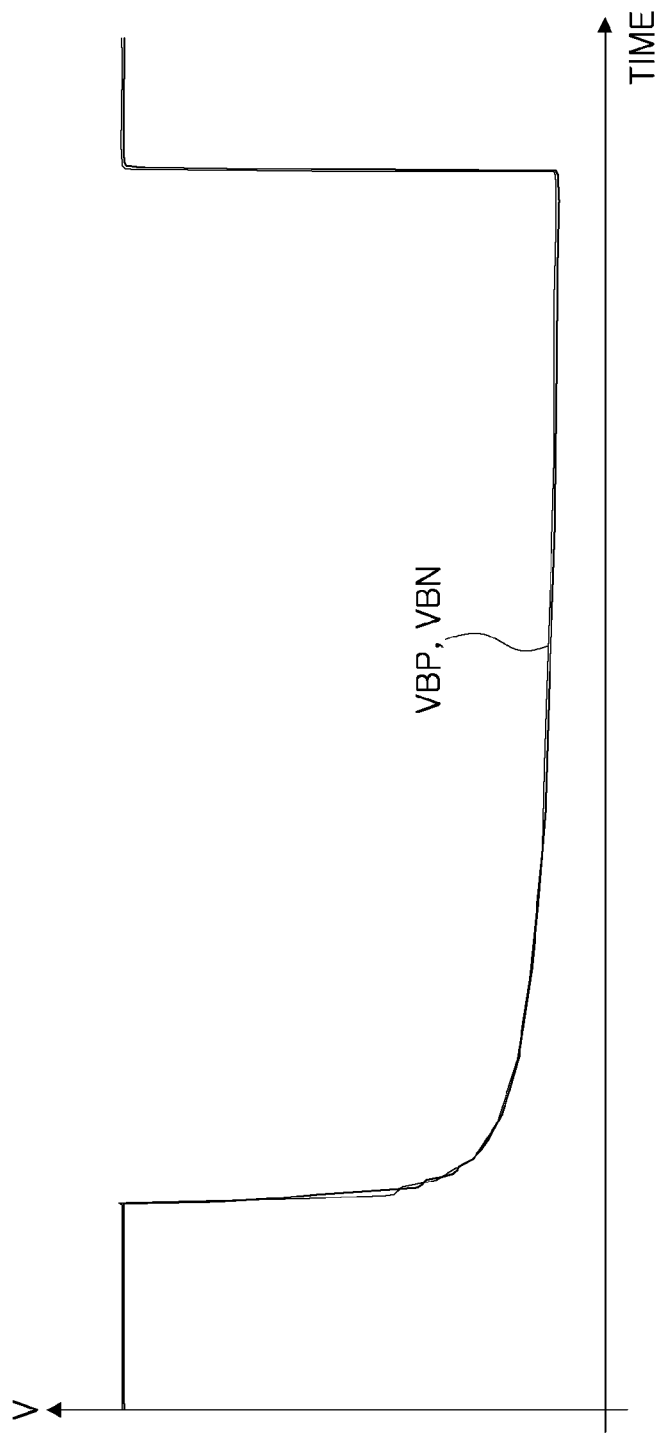

RECEIVER INCLUDING OFFSET COMPENSATION CIRCUIT

CROSS-REFERENCE TO RELATED APPLICATION(S)

This application claims priority under 35 USC 119(a) to Korean Patent Application No. 10-2021-0167272 filed on Nov. 29, 2021 and Korean Patent Application No. 10-2022-0042072 filed on Apr. 5, 2022 in the Korean Intellectual Property Office, the disclosure of each of which is incorporated herein by reference in its entirety.

BACKGROUND

The present inventive concept relates to a receiver receiving a single-ended signal and outputting a differential signal.

Electronic devices include various functional blocks or devices configured to provide various functions. Various functional blocks or devices may exchange data with each other through receivers.

A certain receiver may generate a differential signal based on a single-ended signal received through a transmission line. The receiver may include elements that mate with each other to generate a differential signal. In the case in which there is a mismatch or asymmetric aging between paired elements, an adverse effect may occur on the Ratio of Level separation Mismatch (RLM) or margin in the eye diagram of the differential signal.

Accordingly, it is required that the receiver be able to detect the offset of the differential signal and compensate for the offset.

SUMMARY

An aspect of the present inventive concept is to provide a receiver in which an offset voltage of a differential signal generated by a differential signal generator may be detected and the offset of the differential signal generator may be compensated.

An aspect of the present inventive concept is to provide a receiver including an offset voltage detection circuit in which an offset voltage of a differential signal may be detected without using a separate voltage or current source.

According to example embodiments, a receiver includes a differential signal generator receiving a single-ended signal, and generating differential signals having a positive signal and a negative signal complementary to the positive signal based on the single-ended signal, a reference signal, and a pair of compensation signals; a positive charging circuit charging a first node to a power level in a logic low period of a clock signal; a negative charging circuit charging a second node to the power level in the logic low period of the clock signal; a positive discharging circuit discharging the first node according to a signal level of the positive signal in a logic high period of the clock signal; a negative discharging circuit discharging the second node according to a signal level of the negative signal in the logic high period of the clock signal; a comparator comparing a signal level of the first node and a signal level of the second node and outputting an offset detection signal of the differential signals in response to a result of the comparison; and an offset compensator outputting the reference signal and the pair of compensation signals, each adjusted based on the offset detection signal obtained from the comparator, to the differential signal generator.

According to example embodiments, a receiver includes a differential signal generator receiving a single-ended signal, and generating differential signals based on the single-ended signal, a reference signal, and a pair of compensation signals; a boundary detector receiving a power signal and charging first and second nodes in a charging period, discharging the first node according to a level of a positive signal among the differential signals and the second node according to a level of a negative signal among the differential signals in a discharging period after the charging period, outputting a signal of the first node as a positive boundary signal, and outputting a signal of the second node as a negative boundary signal; a comparator generating a plurality of offset detection signals by comparing a level of the positive boundary signal and a level of the negative boundary signal a plurality of times within the discharging period; a voting unit outputting an offset polarity signal representing the discharging period, using the plurality of offset detection signals obtained from the comparator; an up-down counter incrementing or decrementing a count value based on the final offset signal; and one or more digital-analog converters (DACs) outputting the reference signal and the pair of compensation signals adjusted based on the count value.

According to example embodiments, a receiver includes a differential signal generator receiving a single-ended signal, and generating differential signals based on the single-ended signal, a reference signal, and a pair of compensation signals; a boundary detector periodically charging first and second nodes and discharging the charged first and second nodes based on a clock signal and the differential signals, and outputting boundary signals corresponding to a minimum level of the differential signals; a comparator generating offset detection signals by comparing levels of the boundary signals; a voting unit determining an offset polarity of the differential signals using the offset detection signals obtained from the comparator, and outputting an offset polarity signal; an up-down counter determining a first count value by increasing or decreasing a count value according to offset polarity signals output in an untwisted state of an input terminal and an output terminal of the boundary detector, determining a second count value by increasing or decreasing a count value according to offset polarity signals output in a twisted state of the input and output terminals of the boundary detector, and outputting a final count value in which an influence of offset of the boundary detector has been canceled based on the first count value and the second count value; and one or more digital-analog converters (DACs) outputting the reference signal and the pair of compensation signals adjusted based on the final count value.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 7A, 7B, and 8A to 8C are diagrams illustrating in detail an offset compensation method of a differential signal generator according to example embodiments;

DETAILED DESCRIPTION

Hereinafter, various embodiments will be described in detail with reference to the accompanying drawings.

Figure 1:
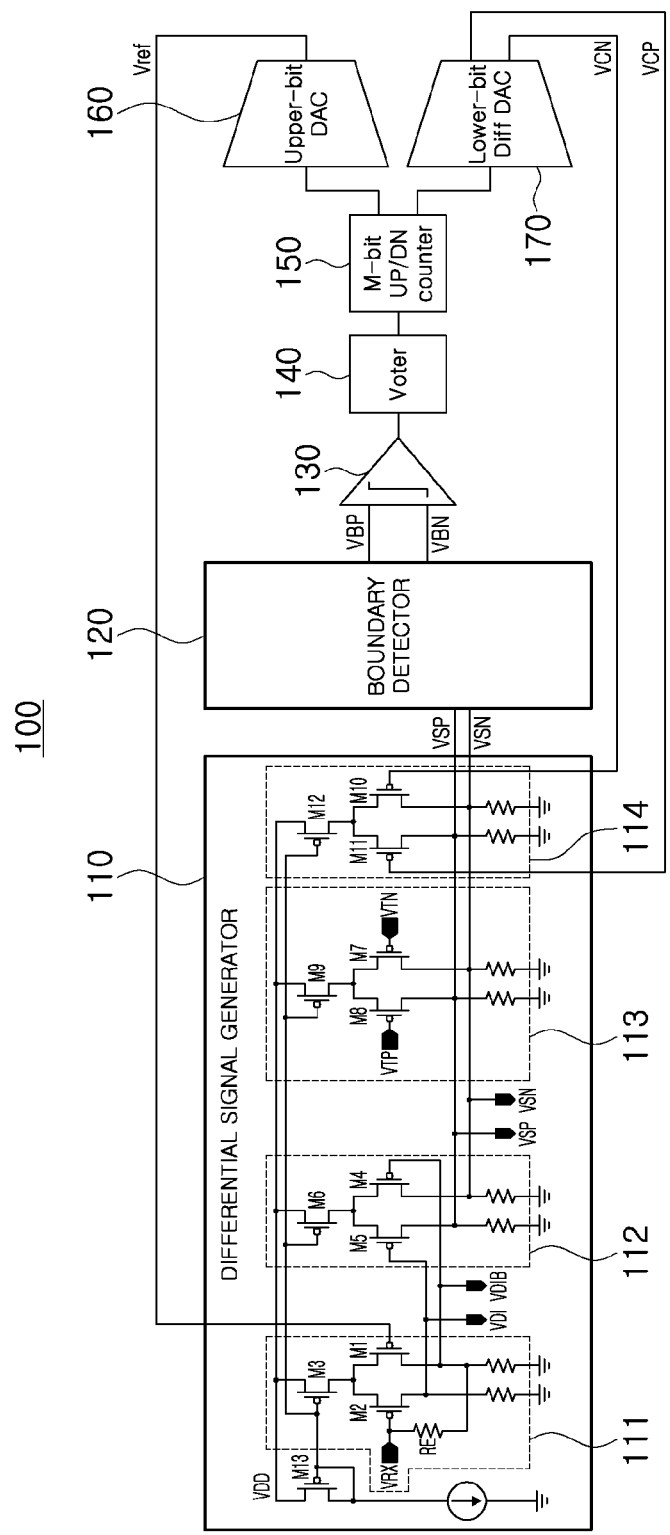
FIG. 1 is a diagram illustrating a receiver according to an example embodiment.

FIG. 1 is a diagram illustrating a receiver according to an example embodiment.

Referring to FIG. 1, a receiver 100 may include a differential signal generator 110, a boundary detector 120, a comparator 130, a voting unit 140, an up-down counter 150, and a plurality of digital-analog converters (DACs) 160 and 170.

The differential signal generator 110 may receive a single-ended signal VRX from the outside of the receiver 100, and output differential signals VSP and VSN based on the received single-ended signal VRX. Herein, for convenience of description, terms of the differential signals and a differential signal may be used interchangeably.

The single-ended signal may include a real signal and a ground signal. The signal level of the single-ended signal may be determined with a value measured with respect to the ground signal. When noise occurs in the real signal in a single-ended signal, it may be difficult to cancel the noise.

The differential signal may include two signals having the same amplitude and phases opposite to each other. Hereinafter, two signals included in the differential signals VSP and VSN may be referred to as a positive signal VSP and a negative signal VSN. The negative signal VSN may be a complementary signal of the positive signal VSP.

The signal level of the differential signal may be determined by the difference between the two signals. On the other hand, when two signals are transmitted through adjacent signal lines, common mode noise may be included in the two signals. Even when common mode noise is included in the two signals, a difference between the two signals may be maintained. Since the signal level of the differential signal is determined by the difference between the two signals, the common mode noise may be canceled.

On the other hand, when the offset voltage is generated in the differential signal due to the offset of the differential signal generator 110 itself, the offset voltage is difficult to be easily removed even by the difference between the two signals. For example, the differential signal generator 110 may include a plurality of devices, and some of the plurality of devices may be paired with each other. A mismatch may occur between paired devices due to minute differences in manufacturing processes, or different levels of aging may occur when the devices are used. An offset may occur in the differential signal generator 110 due to mismatch or aging of paired elements.

Referring to FIG. 1, the differential signal generator 110 may include a single ended to differential (S2D) converter 111, a differential amplifier 112, a decision feedback equalizer (DFE) 113, and a differential compensator 114.

The S2D converter 111 may output differential signals VDI and VDIB based on the externally received single-ended signal VRX. The S2D converter 111 may use a reference signal Vref to output the differential signals VDI and VDIB. For example, the S2D converter 111 may output the main signal VDI having a phase opposite to the single-ended signal VRX, and output an inverted signal VDIB obtained by inverting the phase of the main signal VDI based on the reference signal Vref.

The differential amplifier 112 may amplify a differential signal. In addition, the DFE 113 may remove an Inter-Symbol Interference (ISI) effect expected from the previous data value of the differential signal, from the current data to reduce the ISI effect of the amplified differential signal. In this case, the ISI refers to a phenomenon in which previously transmitted data affects currently transmitted data due to a limitation of the bandwidth of a data channel. The DFE 113 may change signal levels of the differential signal by signal levels of previous data signals VTP and VTN. Each of the previous data signals VTP and VTN may be a digital signal and may be provided from a certain circuit (not shown) included in the receiver 100. The differential compensator 114 may change signal levels of the differential signal by signal levels of compensation signals VCP and VCN. The differential signals VDI and VDIB may pass through the differential amplifier 112, the DFE 113, and the differential compensator 114 to be output as final differential signals VSP and VSN.

Referring to FIG. 1, the differential signal generator 110 may include a plurality of transistors M1-M13. Among the transistors, M1 and M2, M4 and M5, M7 and M8, and M10 and M11 may be paired with each other. An offset may occur in the differential signal generator 110 due to mismatch or aging of paired transistors, and an offset voltage may be generated between the differential signals VSP and VSN.

According to an example embodiment, the receiver 100 detects a minimum level of each of the positive signal VSP and the negative signal VSN included in the differential signals VSP and VSN, and compares the minimum levels, thereby determining whether the differential signals VSP and VSN have a positive offset voltage or a negative offset voltage. The receiver 100 may compensate for the offset of the differential signals VSP and VSN by adjusting a level of the reference voltage Vref or levels of the compensation voltages VCN and VCP according to the determination. Herein, for convenience of description, the terms of the reference voltage Vref and the reference signal Vref may be used interchangeably, the terms of the compensation voltages VCN and VCP and the compensation signals VCN and VCP may be used interchangeably, and the terms of the signal level(s) and level(s) may be used interchangeably.

Upon receiving the differential signals VSP and VSN, the boundary detector 120 may output boundary signals VBP and VBN indicating the minimum level of the differential signals VSP and VSN. According to an example embodiment, the boundary detector 120 may output the boundary signals VBP and VBN while periodically repeating charging and discharging of the boundary signals VBP and VBN.

For example, the boundary detector 120 may receive a power signal in the charging period and charge the boundary signals VBP and VBN to a power level. In addition, the boundary detector 120 may discharge the charged positive boundary signal VBP according to the level of the positive signal VSP in the discharging period after the charging period, and may discharge the charged negative boundary signal VBN according to the level of the negative signal VSN.

The comparator 130 may compare the signal levels of the boundary signals VBP and VBN, and output an offset detection signal indicating whether the positive boundary signal VBP is greater or the negative boundary signal VBN is greater.

The voting unit 140, the up/down counter 150, and the plurality of DACs 160 and 170 may constitute an offset compensator (or an offset compensation circuit) that outputs the reference signal Vref and a pair of compensation signals VCP and VCN adjusted to compensate for the offset of the differential signal generator 110, based on the offset detection signal output from the comparator 130.

The voting unit 140 may receive offset detection signals from the comparator 130 several times within a predetermined interval, and may output a final offset signal indicating whether the differential signals VSP and VSN have a positive offset voltage or a negative offset voltage within the predetermined interval, based on the offset detection signals. For example, a case in which the positive signal VSP has a higher direct current (DC) level than that of the negative signal VSN is defined as a case in which a positive offset voltage is present, and a case in which the positive signal VSP has a lower DC level than the negative signal VSN may be defined as a case in which the negative offset voltage is present.

The up/down counter 150 may have a count value for determining the reference signal Vref and the compensation signals VCP and VCN. The up-down counter 150 may adjust the signal levels of the reference signal Vref and the pair of compensation signals VCP and VCN by increasing or decreasing the count value based on the value of the final offset signal.

Depending on the implementation, the count value may have an M (M is a natural number) bit value, and the upper K (K is a natural number) bit value of the M bit values is used to determine the signal level of the reference signal Vref, and the lower (M−K) bit value may be used to determine the signal level of the compensation signals VCP and VCN. For example, K may be (M/2).

The plurality of DACs 160 and 170 may receive the count value corresponding to a digital signal and output the reference signal Vref and compensation signals VCP and VCN corresponding to an analog signal. Depending on the implementation, the upper-bit DAC 160 may receive the high-order K-bit value among the count values and output the reference signal Vref. In addition, the lower-bit DAC 170 may receive the low-order (M−K) bit value among the count values and output compensation signals VCP and VCN.

The level of the reference signal Vref may increase by a first unit level whenever the K-bit value increases by '1.' The level of the positive compensation signal VCP decreases by a second unit level whenever the (M−K) bit value increases by '1,' and the level of the negative compensation signal VCN may increase by the second unit level whenever the (M−K) bit value increases by '1.'

The reference signal Vref may significantly adjust the levels of the differential signals VSP and VSN, and the compensation signals VCP and VCN may finely adjust the levels of the differential signals VSP and VSN. For example, the first unit level may have a greater value than the second unit level. However, to fine-tune the levels of the differential signals VSP and VSN in all voltage ranges, the first unit level may have a value lower than $2^{(M-K)}$ times the second unit level.

The reference signal Vref and the compensation signals VCP and VCN may be fed back to the differential signal generator 110, and the differential signal generator 110 outputs differential signals VSP and VSN in which the magnitude of the offset voltage is reduced. For example, the offset of the differential signal generator 110 may be compensated.

Hereinafter, an offset compensation process of the differential signal generator according to example embodiments will be described in detail with reference to FIGS. 2A to 2D, 3 to 6, 6A, 6B, 7A, 7B, and 8A to 8C.

FIGS. 2A to 2D are diagrams schematically illustrating an offset compensation method of a differential signal generator according to example embodiments.

Figure 2A:
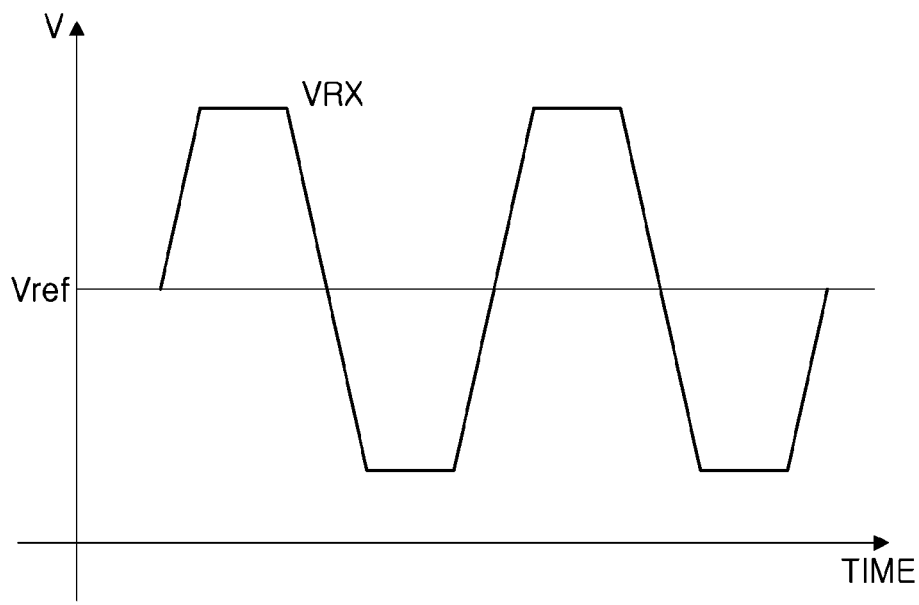
FIGS. 2A to 2D are diagrams schematically illustrating an offset compensation method of a differential signal generator according to example embodiments.

FIG. 2A is a graph illustrating a signal level of a single-ended signal VRX over time. The single-ended signal VRX may be a signal having one of two signal levels in a signal period. The differential signals VDI and VDIB may be generated based on the single-ended signal VRX and the reference signal Vref.

Figure 2B:
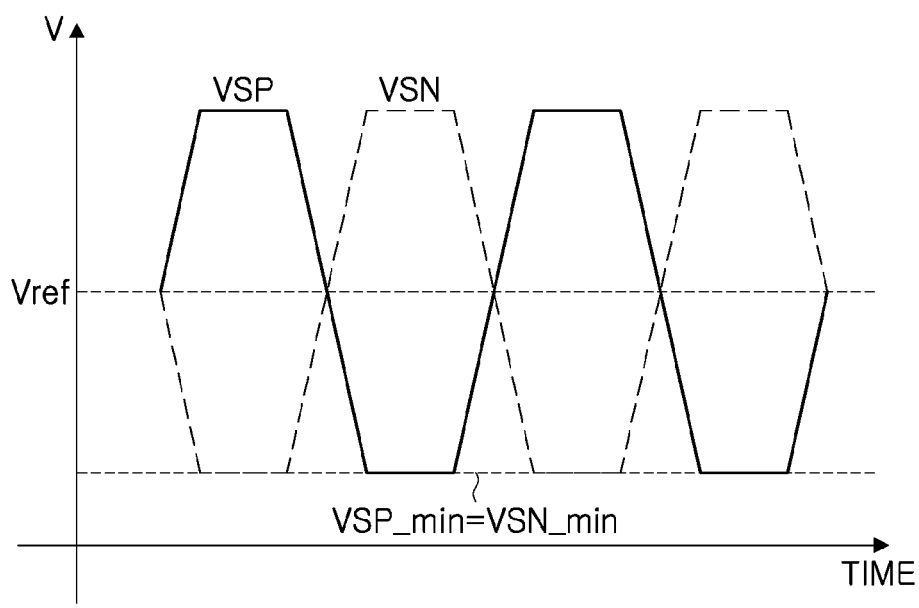

FIG. 2B is a graph illustrating signal levels of ideal differential signals VSP and VSN over time. When there is no offset in the differential signal generator 110, the DC levels of the positive signal VSP and the negative signal VSN may both be the same as the level of the reference signal Vref. For example, the differential signals VSP and VSN may not have an offset voltage. When the differential signals VSP and VSN do not have an offset voltage, minimum levels VSP_min and VSN_min of the positive signal and the negative signal may also be the same.

Figure 2C:
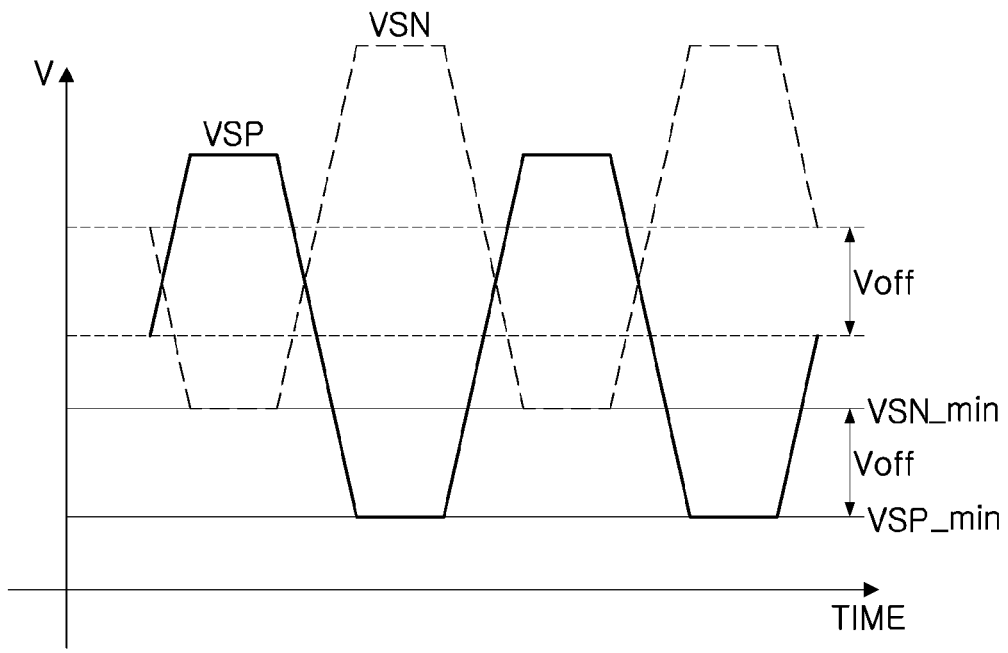

FIG. 2C is a graph illustrating signal levels of differential signals VSP and VSN having an offset voltage over time. When the differential signal generator 110 has asymmetry, the DC levels of the positive signal VSP and the negative signal VSN may be different. The offset voltage Voff may represent a difference between the DC levels of the positive signal VSP and the negative signal VSN.

On the other hand, in FIG. 2C, the DC level of the positive signal VSP may be lower than the DC level of the negative signal VSN, and the differential signals VSP and VSN may have a negative offset voltage. When the differential signals VSP and VSN have a negative offset voltage, the minimum level VSP_min of the positive signal may have a value lower than the minimum level VSN_min of the negative signal.

Figure 2D:
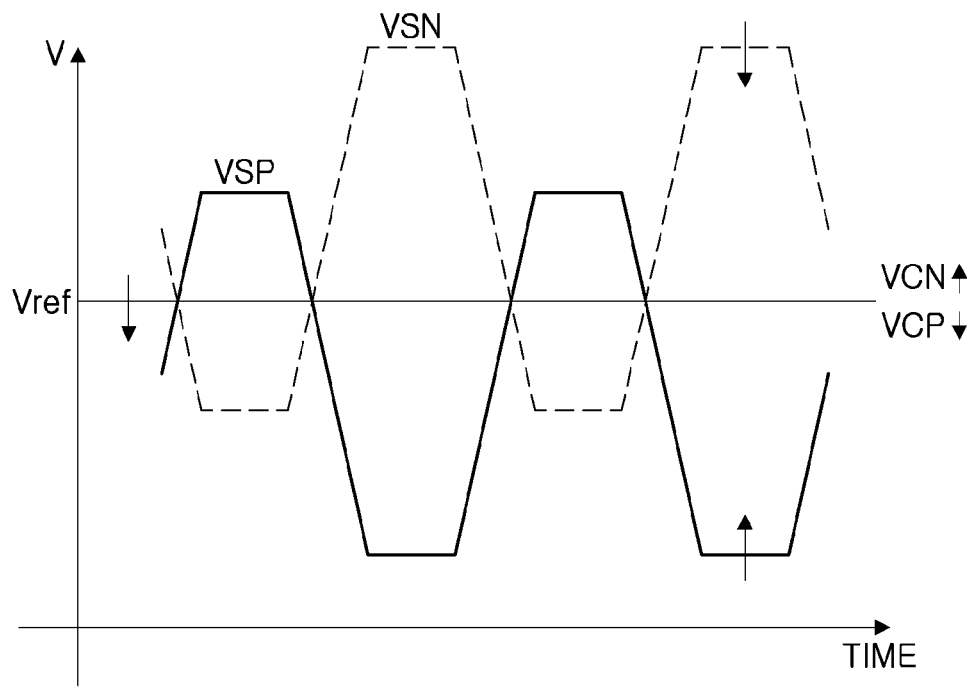

FIG. 2D is a graph illustrating levels of a reference voltage Vref and compensation voltages VCP and VCN for compensating an offset of a differential signal generator. As described in FIG. 2C, when the differential signals VSP and VSN have negative offset voltages, the level of the reference voltage Vref may be lowered to reduce the magnitude of the offset voltage between the differential signals VSP and VSN. Alternatively, the magnitude of the offset voltage between the differential signals VSP and VSN may be reduced by decreasing the level of the positive compensation signal VCP and increasing the level of the negative compensation signal VCN.

Figure 3:
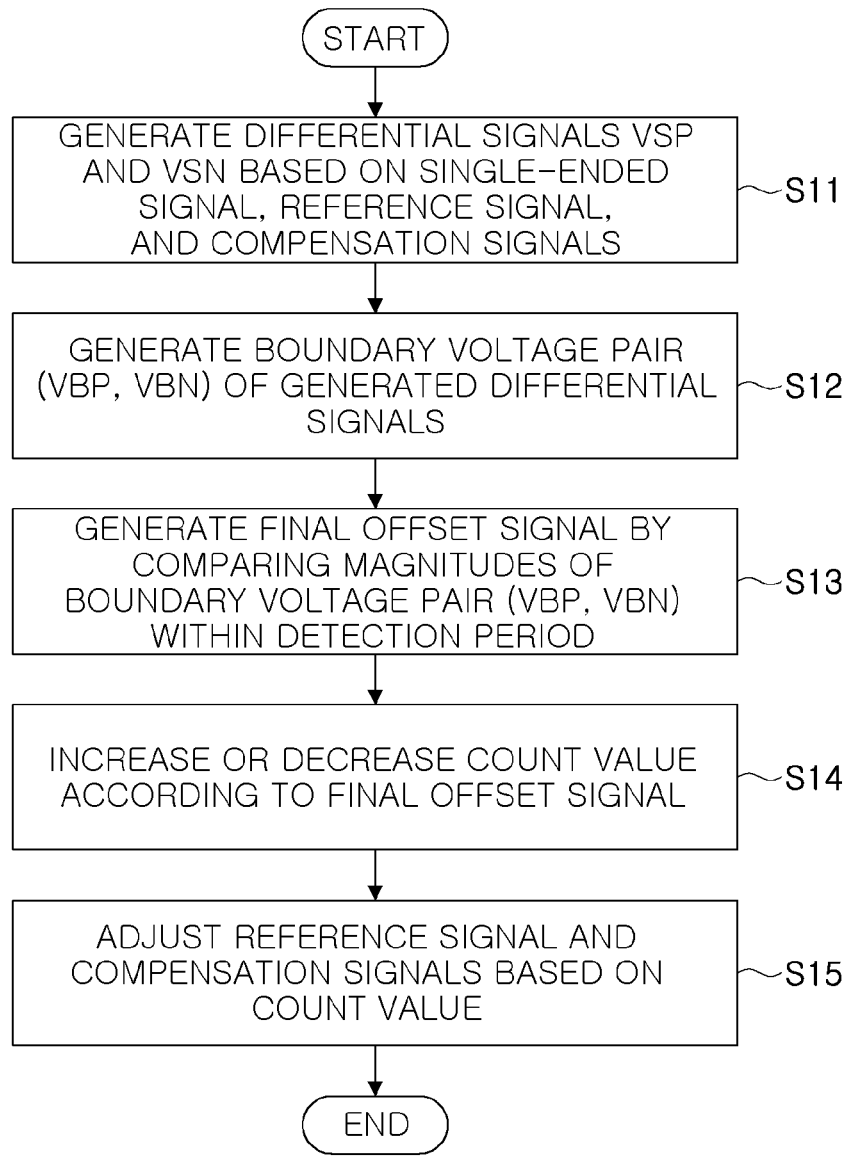
FIG. 3 is a flowchart illustrating a method of operating a receiver according to an example embodiment.

FIG. 3 is a flowchart illustrating a method of operating a receiver according to an example embodiment.

In operation S11, the receiver may generate differential signals VSP and VSN based on the received single-ended signal VRX, the reference signal Vref, and the compensation signals VCP and VCN. A method of generating the differential signals VSP and VSN by the receiver is described above with reference to FIG. 1.

In operation S12, the receiver may generate boundary signals VBP and VBN of the differential signals VSP and VSN. The boundary signals VBP and VBN may correspond to the minimum levels VSP_min and VSN_min of the differential signals described with reference to FIGS. 2B and 2C. A detailed method for the receiver to generate the boundary signals VBP and VBN will be described later with reference to FIGS. 4, 5, 6A and 6B.

In operation S13, the receiver may generate a final offset signal by comparing the magnitudes of the boundary signals VBP and VBN within the discharging period.

In operation S14, the receiver may increase or decrease the count value according to the final offset signal.

In operation S15, based on the increased or decreased count value, the adjusted reference signal Vref and compensation signals VCP and VCN may be output. Based on the adjusted reference signal Vref and compensation signals VCP and VCN, the differential signals VSP and VSN in which the magnitude of the offset voltage is reduced may be output.

Hereinafter, a detailed method of generating boundary signals VBP and VBN by the receiver will be described with reference to FIGS. 4, 5, 6A and 6B.

Figure 4:
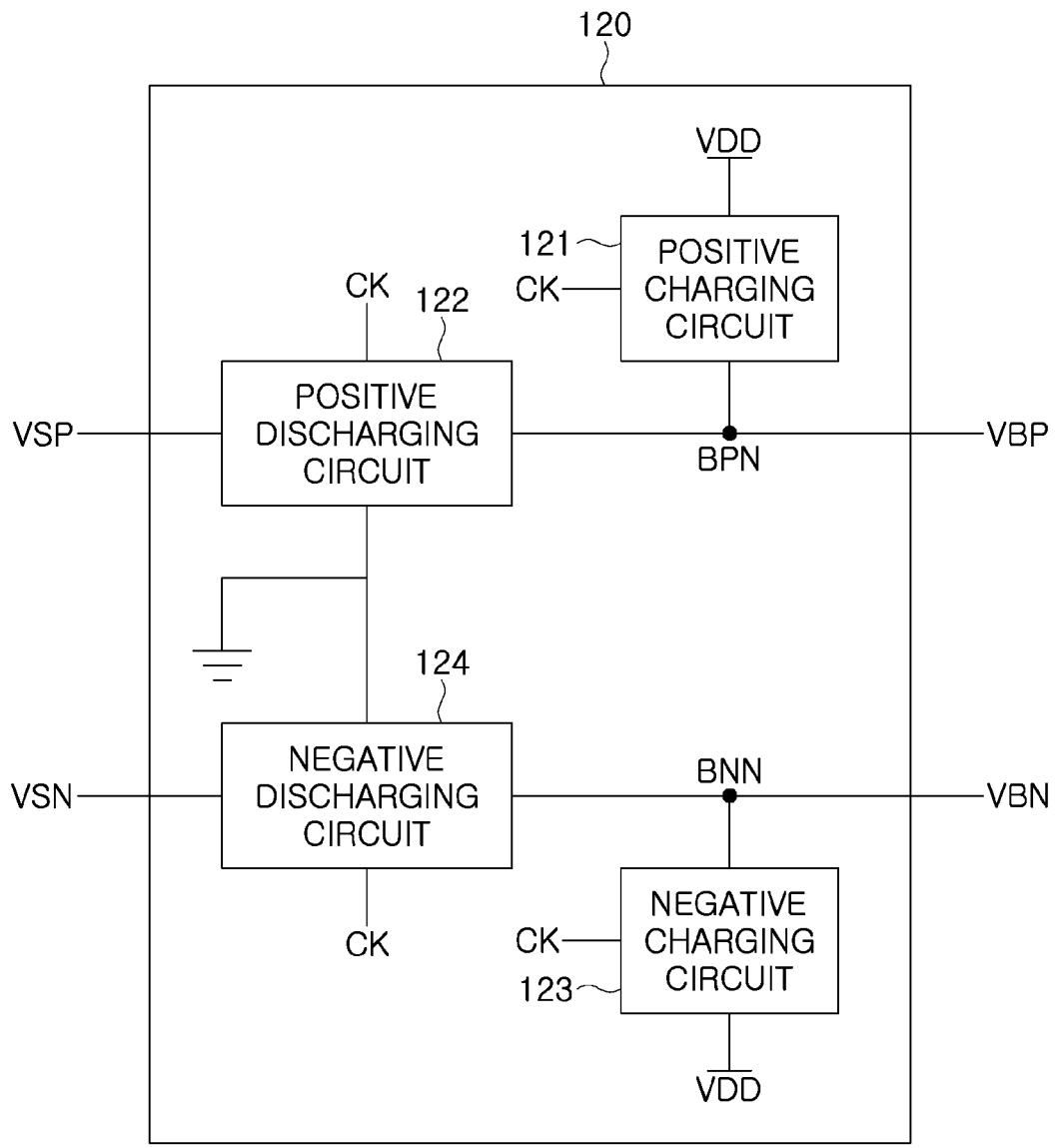
FIG. 4 is a block diagram schematically illustrating a structure of a boundary detector according to an example embodiment.
Figure 5:
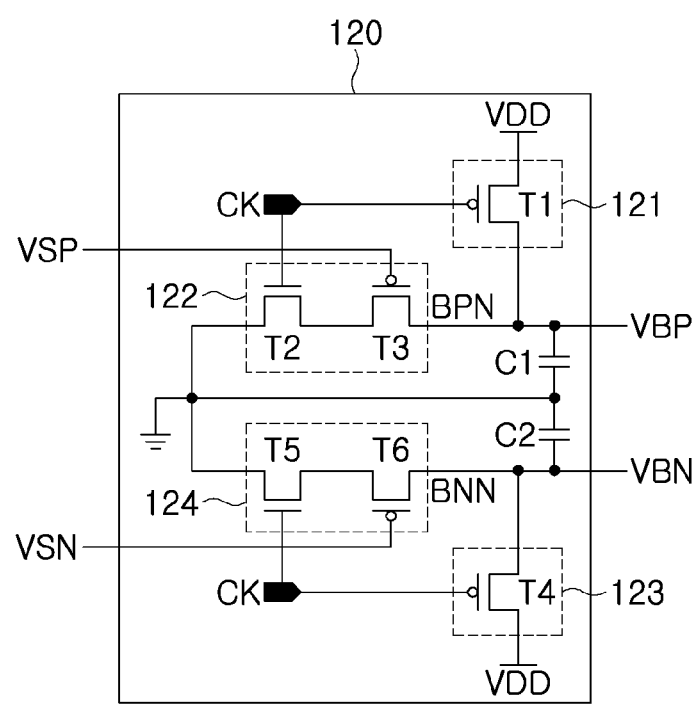
FIG. 5 is a circuit diagram illustrating in detail the structure of a boundary detector according to an example embodiment.
Figure 6A:
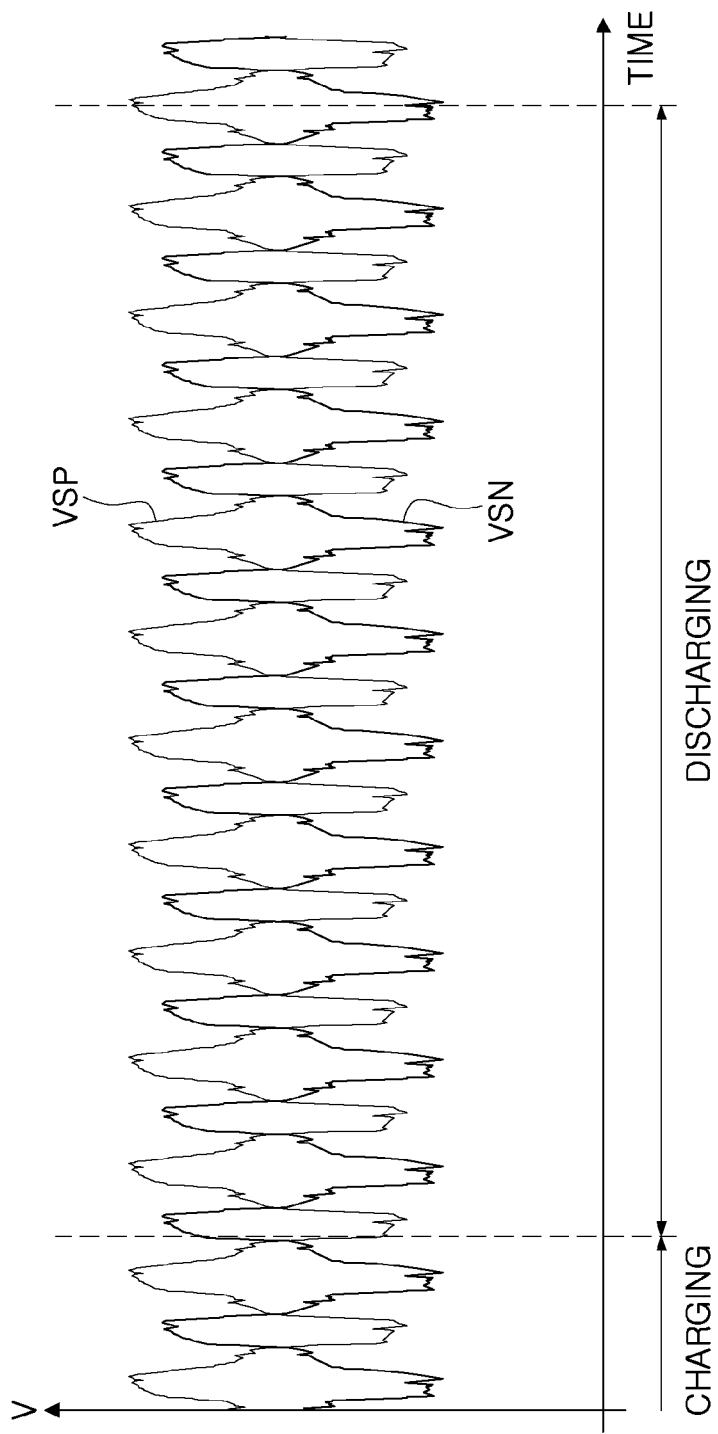
FIGS. 6A to 6B are diagrams illustrating signal levels of boundary signals according to a differential signal.
Figure 6B:
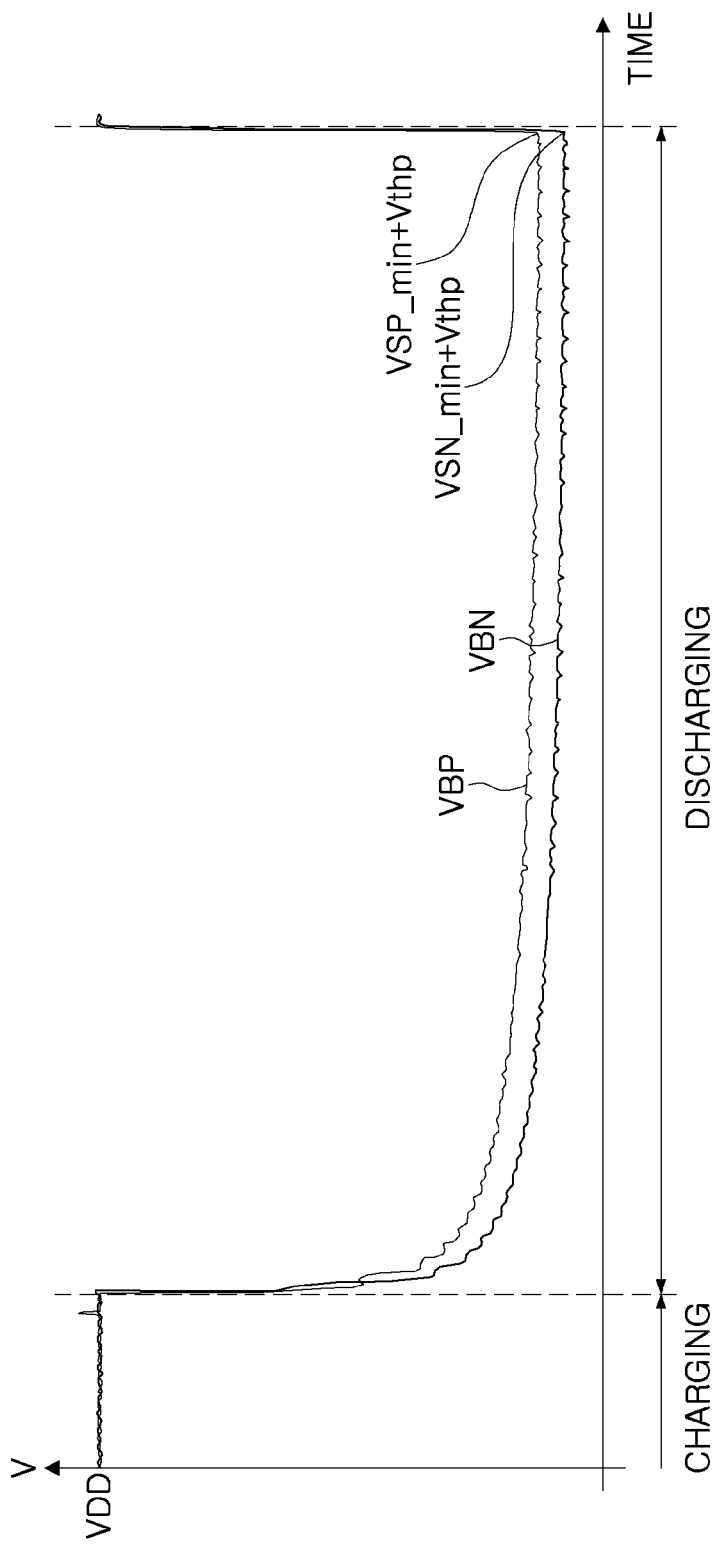

FIG. 4 is a block diagram schematically illustrating a structure of a boundary detector according to an example embodiment. FIG. 5 is a circuit diagram illustrating in detail the structure of a boundary detector according to an example embodiment. FIGS. 6A and 6B are diagrams illustrating signal levels of boundary signals VBP and VBN according to differential signals VSP and VSN.

Referring to FIG. 4, the boundary detector 120 may include a positive charging circuit 121, a positive discharging circuit 122, a negative charging circuit 123, and a negative discharging circuit 124. The positive charging circuit 121 and the negative charging circuit 123, and the positive discharging circuit 122 and the negative discharging circuit 124, may be paired with each other.

The boundary detector 120 may operate based on a signal swinging at two levels, such as a clock signal CK. The boundary detector 120 may charge a positive boundary node BPN and a negative boundary node BNN in the charging period defined by the clock signal CK, and discharge the positive boundary node BPN and the negative boundary node BNN in the discharging period defined by the clock signal CK. The boundary detector 120 may further include a first capacitor C1 and a second capacitor C2. The first capacitor C1 may be connected between the positive boundary node BPN and a ground, and the second capacitor C2 may be connected between the negative boundary node BNN and the ground.

In the charging period, the positive charging circuit 121 may receive a power signal VDD and charge the positive boundary node BPN to the power level. Similarly, the negative charging circuit 123 may receive the power signal VDD and charge the negative boundary node BNN to the power level. In the charging period, the positive discharging circuit 122 and the negative discharging circuit 124 may be disabled.

In the discharging period, the positive charging circuit 121 and the negative charging circuit 123 may be disabled. In addition, the positive discharging circuit 122 may receive the positive signal VSP and discharge the positive boundary node BPN according to the current level of the positive signal VSP. Similarly, the negative discharging circuit 124 may receive the negative signal VSN and discharge the negative boundary node BNN according to the current level of the negative signal VSN.

FIG. 6A illustrates the levels of the differential signals VSP and VSN according to time, and FIG. 6B illustrates the levels of the boundary signals VBP and VBN according to time. Referring to FIGS. 6A and 6B, the length of the discharging period may be longer than one period of the differential signals VSP and VSN. The length of the discharging period may vary depending on the implementation, but may have a length of, for example, several tens or hundreds of periods of the differential signals VSP and VSN. The differential signals VSP and VSN may reach the minimum level several times within the discharging period. During the discharging period, the positive boundary node BPN and the negative boundary node BNN may be gradually discharged according to the levels of the differential signals VSP and VSN, and may have a signal level corresponding to the minimum level of the differential signals VSP and VSN.

Referring to FIG. 5, the positive charging circuit 121 may include a first transistor T1. The first transistor T1 may be a PMOS transistor, and in the first transistor T1, the gate may be connected to the clock signal CK, the source may be connected to the power signal VDD, and the drain may be connected to the positive boundary node BPN. The first transistor T1 may be turned on when the clock signal CK is in a logic low state to charge the positive boundary node BPN to a power level.

The negative charging circuit 123 may include a fourth transistor T4. The fourth transistor T4 may be a PMOS transistor, in which a gate may be connected to the clock signal CK, a source may be connected to the power signal VDD, and a drain may be connected to the negative boundary node BNN. Like the first transistor T1, the fourth transistor T4 is also turned on when the clock signal CK is in a logic low state to charge the negative boundary node BNN to the power level.

The positive discharging circuit 122 may include second and third transistors T2 and T3. The second transistor T2 may be an NMOS transistor, in which a gate may be connected to the clock signal CK, a drain may be connected to a drain of the third transistor T3, and a source may be connected to the ground. The third transistor T3 may be a PMOS transistor, in which a gate may be connected to the positive signal VSP, and a source may be connected to the positive boundary node BPN.

The second transistor T2 may be turned on when the clock signal CK is in a logic high state. In addition, the third transistor T3 may be turned on when the level of the positive signal VSP is less than a difference between the level of the positive boundary signal VBP and a threshold level (Vthp: Vthp is a positive number) of the third transistor T3.

Referring to FIG. 6B, when the second and third transistors T2 and T3 are turned on, the positive boundary node BPN charged to the power level VDD may be discharged. Herein, for convenience of description, the terms of the power level VDD and the power signal VDD may be used interchangeably. The positive boundary node BPN may be gradually discharged over a plurality of signal periods according to the level of the positive signal VSP. When the level of the positive boundary signal VBP reaches the sum of the minimum level VSP_min of the positive signal VSP and the threshold level Vthp of the third transistor T3, the discharge of the positive boundary node BPN may be terminated. When the level of the positive boundary signal VBP reaches the sum of the minimum level VSP_min of the positive signal VSP and the threshold level Vthp of the third transistor T3, the level of the positive boundary signal VBP cannot become less than the sum of the minimum level VSP_min and the threshold level Vthp of the third transistor T3, which is because the third transistor T3 can no longer be turned on.

Referring back to FIG. 5, the negative discharging circuit 124 may include fifth and sixth transistors T5 and T6. The fifth transistor T5 may be an NMOS transistor, in which a gate may be connected to the clock signal CK, a drain may be connected to a drain of the sixth transistor T6, and a source may be connected to the ground. The sixth transistor T6 may be a PMOS transistor, and in this case, a gate may be connected to the negative signal VSN, and a source may be connected to the negative boundary node BNN.

Like the second transistor T2, the fifth transistor T5 may be turned on when the clock signal CK is in a logic high state. Similar to the third transistor T3, the sixth transistor T6 may be turned on when the level of the negative signal VSN is less than a difference between the level of the negative boundary signal VBN and a threshold level Vthp of the sixth transistor T6.

Referring to FIG. 6B, when the fifth and sixth transistors T5 and T6 are turned on, the negative boundary node BNN charged to the power level VDD may be discharged. The negative boundary node BNN may be gradually discharged over a plurality of signal periods according to the level of the negative signal VSN. When the level of the negative boundary signal VBN reaches the sum of the minimum level VSN_min of the negative signal VSN and the threshold level Vthp of the sixth transistor T6, the discharge of the negative boundary node BNN may be terminated. When the level of the negative boundary signal VBN reaches the sum of the minimum level VSN_min of the negative signal VSN and the threshold level Vthp of the sixth transistor T6, the level of the negative boundary signal VBN cannot become less than the sum of the minimum level VSN_min and the threshold level Vthp of the sixth transistor T6, which is because the sixth transistor T6 can no longer be turned on.

As described with reference to FIG. 2C, the difference between the minimum levels VSP_min and VSN_min of the differential signals may correspond to the offset voltage Voff. The boundary voltages VBP and VBN may further include a threshold level Vthp component in addition to the minimum levels VSP_min and VSN_min of the differential signals, respectively. However, if the third and sixth transistors T3 and T6 have the same threshold level Vthp, the threshold level Vthp component may be offset in the difference value between the boundary voltages VBP and VBN. Accordingly, whether the differential signals VSP and VSN have a positive offset or a negative offset by comparing the boundary voltages VBP and VBN may be determined.

Referring to FIGS. 4 and 5, the boundary detector 120 does not use a separate voltage or current source, but may charge and discharge the boundary nodes BPN and BNN using the power signal VDD and the differential signals VSP and VSN, thereby generating the boundary signals VBP and VBN corresponding to the minimum levels VSP_min and VSN_min of the differential signals. Accordingly, the boundary detector 120 may not consume fixed DC power to determine the offset voltages of the differential signals VSP and VSN. Accordingly, the noise margin of the differential signals VSP and VSN may be improved while reducing power consumption of the receiver 100.

Hereinafter, a method of compensating for an offset of a differential signal based on the boundary signals VBP and VBN will be described in detail with reference to FIGS. 7A, 7B, and 8A to 8C.

Figure 7A:
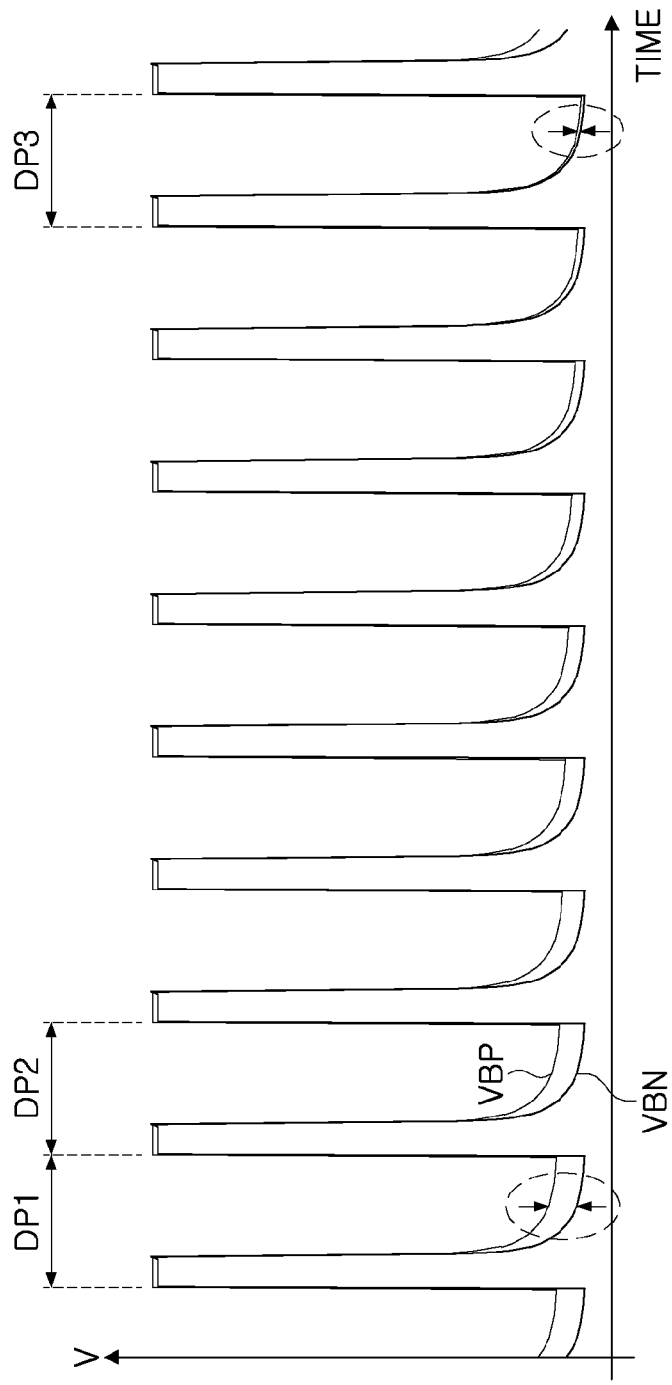
Figure 7B:
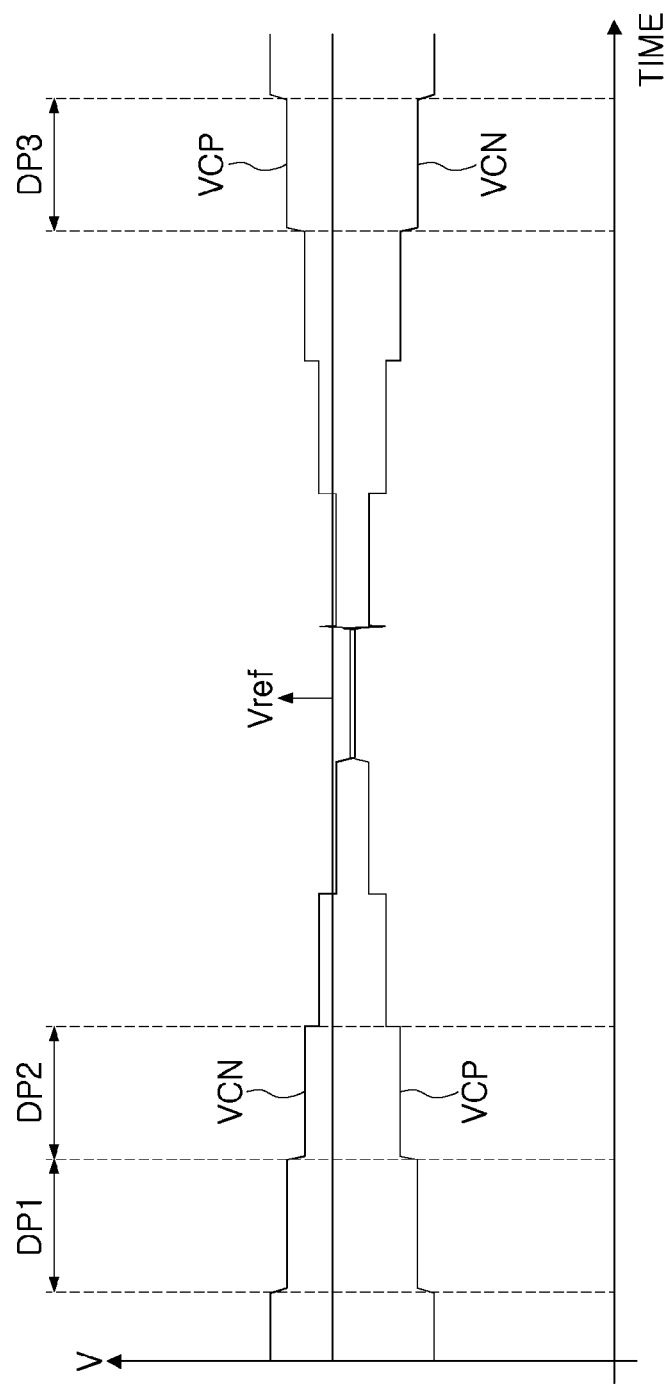

FIG. 7A is a graph illustrating levels of boundary signals VBP and VBN according to time, and FIG. 7B is a graph illustrating levels of a reference signal Vref and compensation signals VCP and VCN according to time.

As described with reference to FIGS. 4, 5, 6A and 6B, the boundary detector 120 may generate the boundary signals VBP and VBN for offset compensation while repeating the charging period and the discharging period of the boundary signals VBP and VBN. Hereinafter, the sum of a set of charging and discharging periods may be referred to as a detection period.

The comparison operation of the boundary signals VBP and VBN may be performed several times in one detection period, and based on the comparison operation results, whether the differential signals VSP and VSN have a positive offset voltage or a negative offset voltage may be determined, and a count value for determining the levels of the reference signal Vref and the compensation signals VCP and VCN may be increased or decreased.

Levels of the reference signal Vref and the compensation signals VCP and VCN may converge to a constant value over several detection cycles. FIGS. 7A and 7B illustrate the levels of the boundary signals VBP and VBN and the levels of the reference signal Vref and the compensation signals VCP and VCN in several detection cycles.

Referring to FIG. 7A, the level of the positive boundary signal VBP may be greater than the level of the negative boundary signal VBN in a first detection period DP1. Referring to FIG. 7B, the positive compensation signal VCP may increase and the negative compensation signal VCN may decrease in a second detection period DP2, which is a detection period subsequent to the first detection period DP1. On the other hand, the reference signal Vref may be maintained.

Referring to FIG. 7A, the level of the positive boundary signal VBP may still be greater than the level of the negative boundary signal VBN in the second detection period DP2. Referring to FIG. 7B, the positive compensation signal VCP may also increase and the negative compensation signal VCN may decrease in the detection period following the second detection period DP2.

As the detection cycle is repeated several times, the values of the compensation signals VCP and VCN may be periodically changed, and the magnitudes of the offset voltages of the differential signals VSP and VSN may gradually decrease. Referring to FIG. 7A, it can be seen that the difference in levels of the boundary signals VBP and VBN is reduced in a third detection period DP3 compared to the first detection period DP1.

Figure 8A:
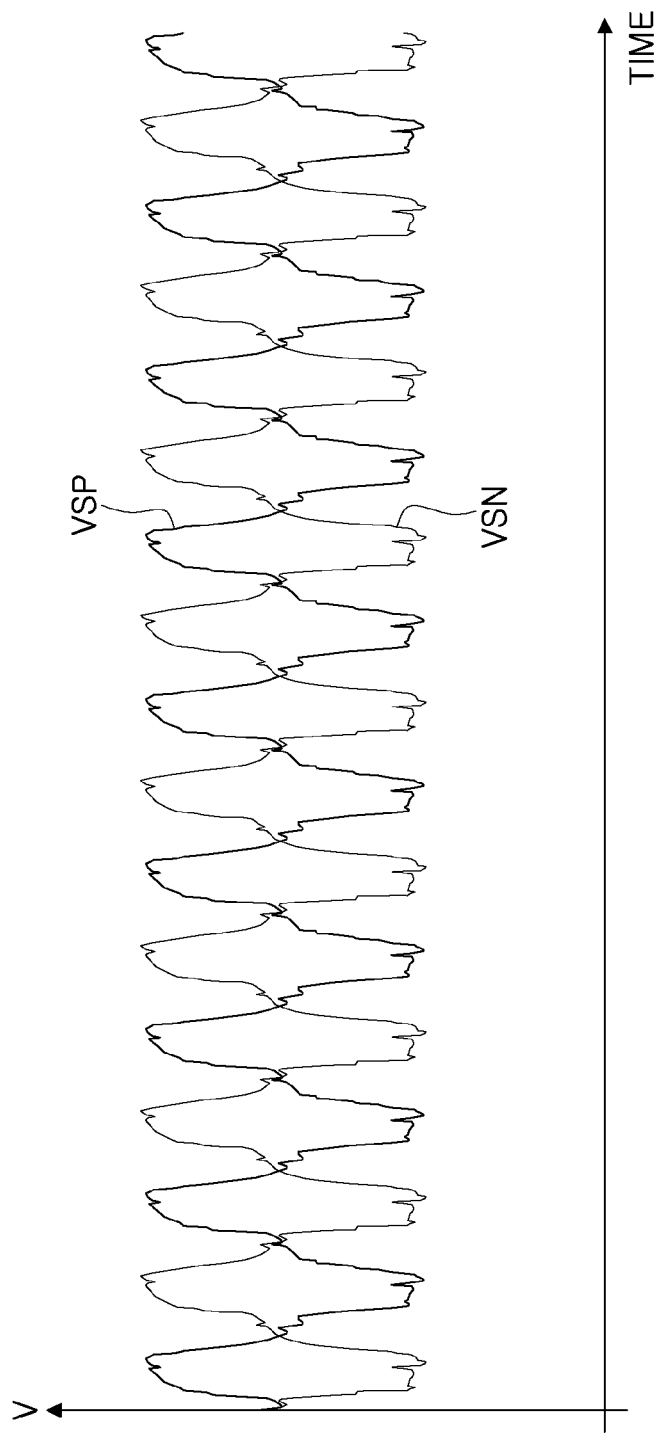
Figure 8C:
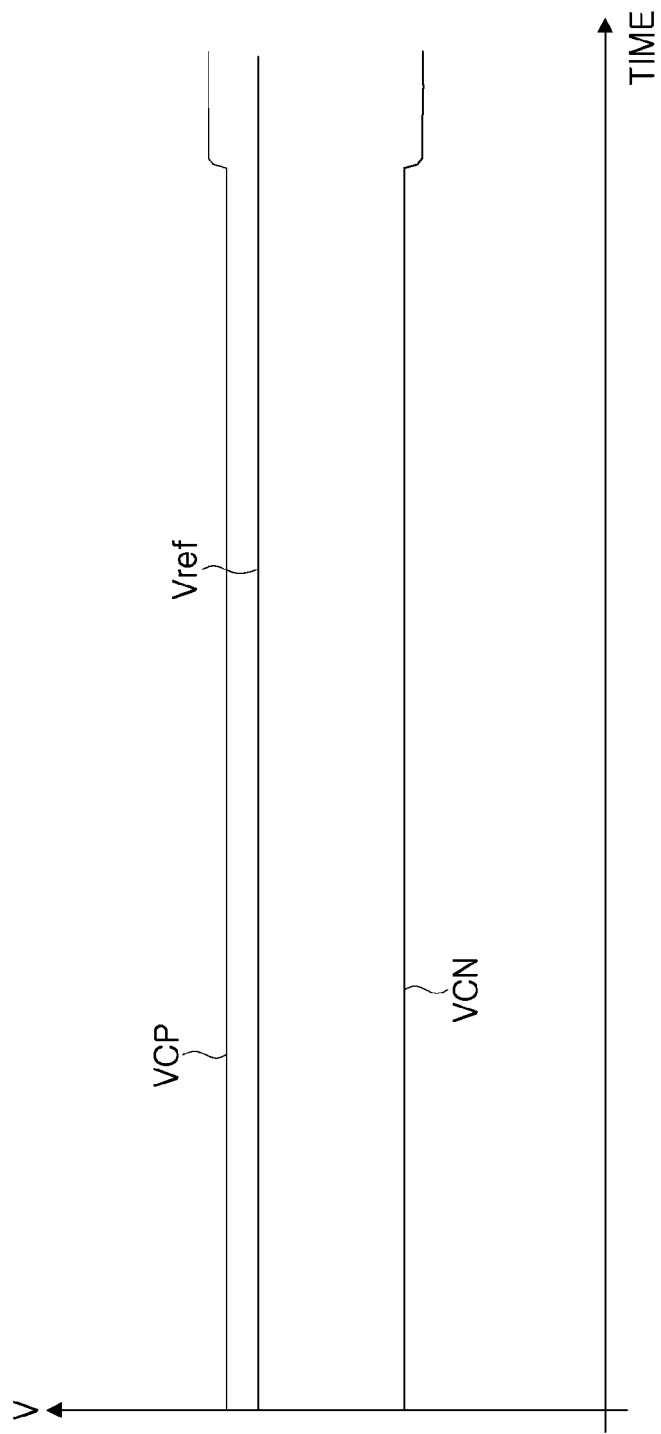

FIGS. 8A to 8C are graphs illustrating levels of signals after offset compensation is completed. FIG. 8A is a graph illustrating the levels of the differential signals VSP and VSN over time, FIG. 8B is a graph illustrating the levels of the boundary signals VBP and VBN over time, and FIG. 8C is a graph illustrating the levels of the reference signal Vref and the compensation signals VCP and VCN.

Referring to FIG. 8A, after offset compensation is completed, the differential signals VSP and VSN may have the same DC level. The minimum levels of the differential signals VSP and VSN may also be the same.

Referring to FIG. 8B, after offset compensation is completed, the boundary signals VBP and VBN may have substantially the same level. Referring to FIG. 8C, after offset compensation is completed, the levels of the reference signal Vref and the compensation signals VCP and VCN may converge to a level similar to the level in the third detection period DP3 of FIG. 7B.

According to an example embodiment, the receiver 100 may determine the offset voltage of the differential signals VSP and VSN in real time using the differential signals VSP and VSN generated based on the externally received single-ended signal VRX, and may dynamically compensate for the offset of the differential signal generator 110. The receiver 100 may effectively compensate for the offset even when the elements included in the differential signal generator 110 are asymmetrically aged over time and the offset of the differential signal generator 110 thus varies. Accordingly, the noise margin of the receiver 100 may be improved.

On the other hand, referring back to FIG. 5, the boundary detector 120 may also include paired elements. In the elements that are paired with each other in the boundary detector 120, there may also be mismatches or elements may be asymmetrically aged. For example, not only the differential signal generator 110 but also the boundary detector 120 may have an offset. A first offset of the differential signal generator 110 and a second offset of the boundary detector 120 may be reflected in the difference of signal levels between the boundary signals VBP and VBN.

Hereinafter, with reference to FIGS. 9 and 10A to 10C, when the first offset of the differential signal generator 110 is compensated for using the boundary signals VBP and VBN, a receiver in which the effect of the second offset of the boundary detector 120 may be removed will be described.

Figure 9:
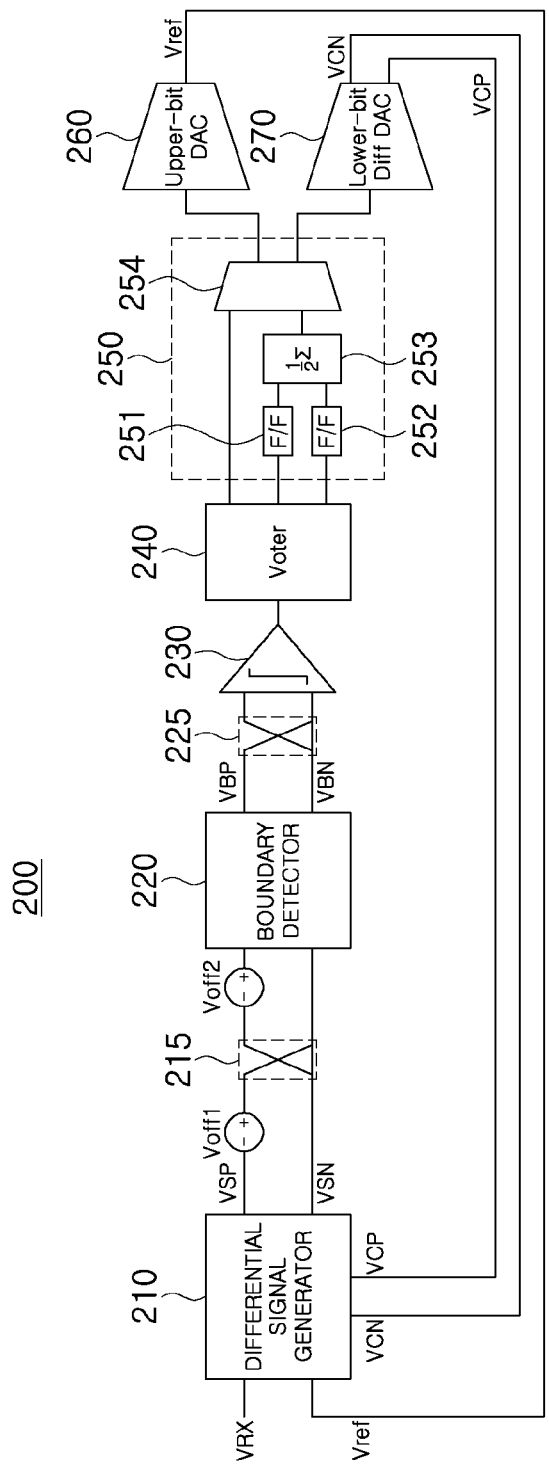
FIG. 9 is a diagram illustrating a receiver according to an example embodiment.

FIG. 9 is a diagram illustrating a receiver according to an example embodiment.

Referring to FIG. 9, a receiver 200 may include a differential signal generator 210, a boundary detector 220, a comparator 230, a voting unit 240, an up/down counter 250 and a plurality of DACs 260 and 270.

The differential signal generator 210, the boundary detector 220, the comparator 230, the voting unit 240 and the plurality of DACs 260 and 270 may operate in substantially the same manner as that of the differential signal generator 110, the boundary detector 120, the comparator 130, the voting unit 140, and the plurality of DACs 160 and 170 described with reference to FIG. 1.

Each of the differential signal generator 210 and the boundary detector 220 may include elements that are paired with each other. Asymmetry may occur in the differential signal generator 210 and the boundary detector 220 due to mismatch or asymmetric aging of paired elements. For example, a first offset may occur in the differential signal generator 210, and a second offset may occur in the boundary detector 220. In FIG. 9, an offset voltage that may be generated by the first offset is illustrated as a first offset voltage Voff1, and an offset voltage that may be generated by the second offset is illustrated as a second offset voltage Voff2.

According to an example embodiment, the receiver 200 twists the differential signals VSP and VSN at an input terminal 215 of the boundary detector 220 and twists the boundary signals VBP and VBN at an output terminal 225 of the boundary detector 220. The receiver 200 may perform a first offset compensation in the untwisted state of the input terminal 215 and the output terminal 225, and perform a second offset compensation in the twisted state of the input terminal 215 and the output terminal 225. In addition, the receiver 200 may obtain the final offset compensation result in which the effect of the second offset has been cancelled by using the first offset compensation result and the second offset compensation result.

The up-down counter 250 may include flip-flops 251 and 252, an operation unit 253, and a multiplexer 254. The flip-flops 251 and 252 may respectively store a first count value according to the first offset compensation and a second count value according to the second offset compensation, and the operation unit 253 may determine a final count value based on the first count value and the second count value. The multiplexer 254 may selectively output the first count value, the second count value, or the final count value. The count value output from the multiplexer 254 may be used to output the reference voltage Vref and the compensation voltages VCP and VCN, in the plurality of DACs 260 and 270.

According to an example embodiment, the receiver 200 may more accurately compensate the offset of the differential signal generator 210 using the boundary signals VBP and VBN.

Figure 10A:
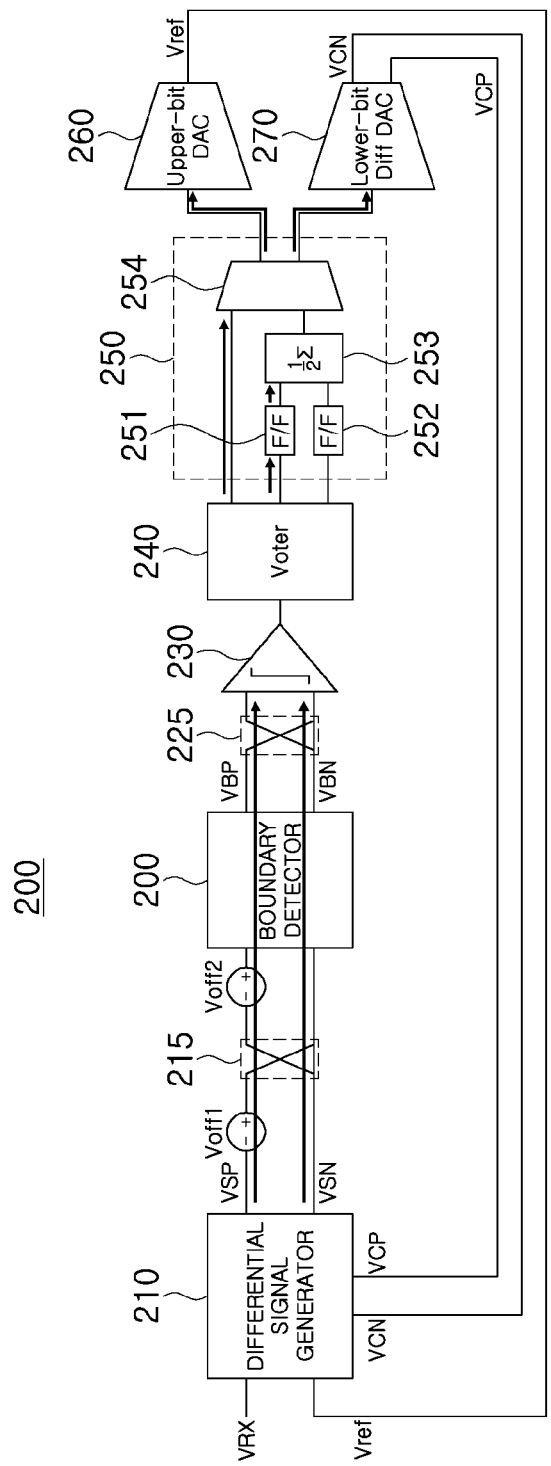
FIGS. 10A to 10C are diagrams illustrating in detail an offset compensation method of a differential signal generator according to example embodiments.
Figure 10B:
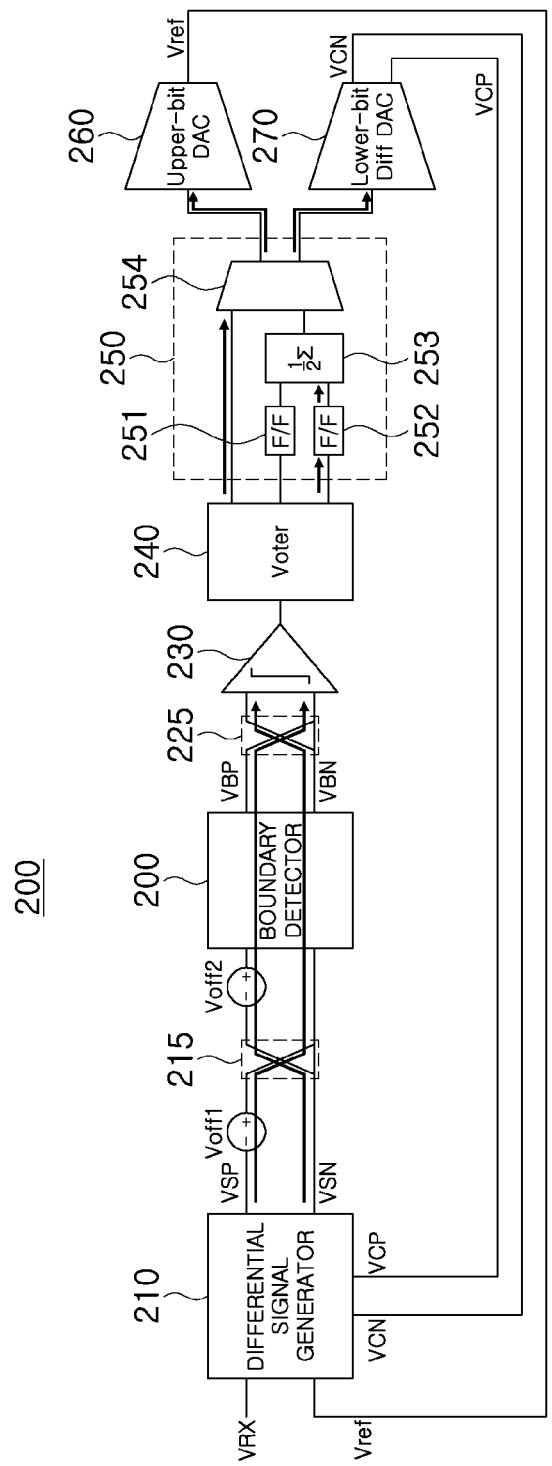
Figure 10C:
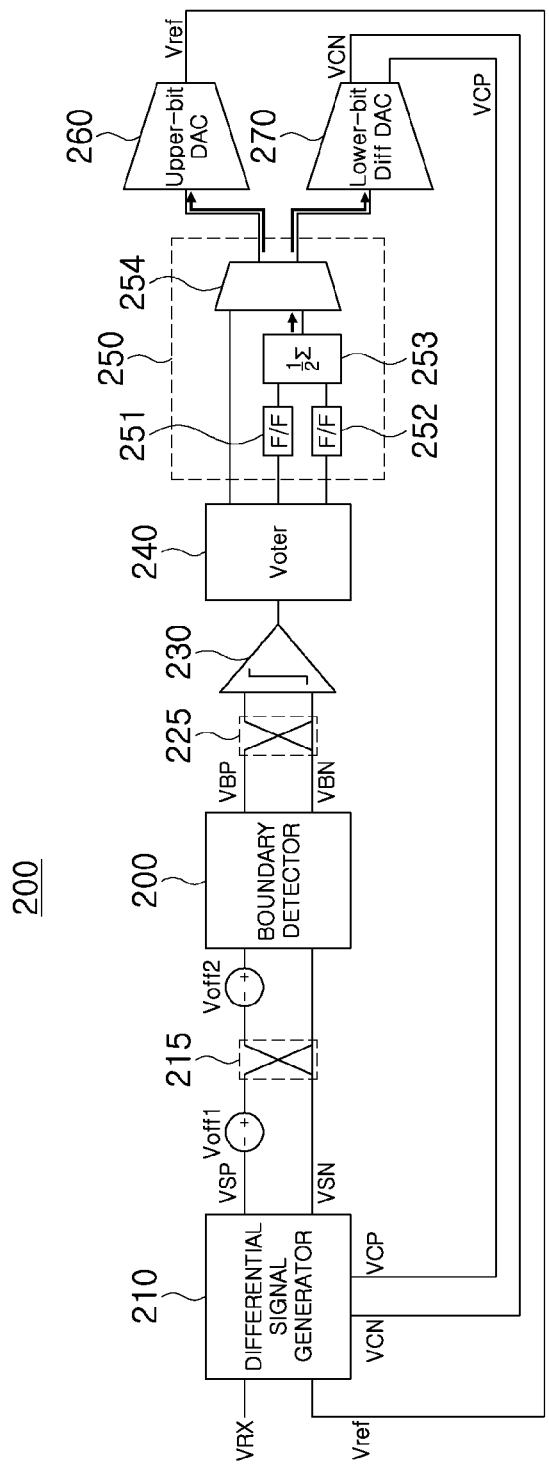

FIGS. 10A to 10C are diagrams illustrating in detail a method of compensating for an offset of a differential signal generator according to example embodiments.

FIG. 10A is a diagram illustrating the operation of the receiver 200 in an untwisted state of the input terminal 215 and the output terminal 225 of the boundary detector 220.

In the untwisted state, in the input terminal 215 of the boundary detector 220, a positive signal VSP may be input to a first terminal, and a negative signal VSN may be input to a second terminal. In addition, in the output terminal 225 of the boundary detector 220, a positive boundary signal VBP may be input to a first terminal, and a negative boundary signal VBN may be input to a second terminal.

In the untwisted state, the difference of signal levels between the boundary signals VBP and VBN may correspond to the sum of the first offset voltage Voff1 and the second offset voltage Voff2.

The receiver 200 may perform first offset compensation over several detection cycles in the untwisted state. The up-down counter 250 increments or decrements a count value based on the offset result signal generated for each detection period, and outputs the count value through the multiplexer 254, thereby adjusting a reference signal Vref and compensation signals VCP and VCN. The up/down counter 250 may perform first offset compensation until a difference of signal levels between the boundary signals VBP and VBN is canceled. The up-down counter 250 may store the first count value after the first offset compensation is completed in the first flip-flop 251.

FIG. 10B is a diagram illustrating the operation of the receiver 200 in a twisted state of the input terminal 215 and the output terminal 225 of the boundary detector 220.

In the twisted state, in the input terminal 215 of the boundary detector 220, the negative signal VSN may be input to the first terminal, and the positive signal VSP may be input to the second terminal. In addition, in the output terminal 225 of the boundary detector 220, the negative boundary signal VBN may be input to the first terminal and the positive boundary signal VBP may be input to the second terminal.

In the twisted state, a difference of signal levels between the boundary signals VBP and VBN may correspond to a difference between the first offset voltage Voff1 and the second offset voltage Voff2.

In the twisted state, the receiver 200 may perform second offset compensation over several detection cycles. The up-down counter 250 increments or decrements a count value based on the offset result signal generated for each detection period, and outputs the count value through the multiplexer 254, thereby adjusting a reference signal Vref and compensation signals VCP and VCN. The up/down counter 250 may perform second offset compensation until a difference between the boundary signals VBP and VBN is canceled. The up-down counter 250 may store the second count value after second offset compensation is completed in the second flip-flop 252.

Since the magnitudes of the offsets between the boundary signals VBP and VBN may be different in the untwisted state and the twisted state, the first count value and the second count value may have different values. The receiver 200 may determine the final count value based on the first count value and the second count value.

FIG. 10C is a diagram illustrating an operation in which the receiver 200 determines a final count value based on a first count value and a second count value.

The up-down counter 250 may sum the first count value stored in the first flip-flop 251 and the second count value stored in the second flip-flop 252, using the operation unit 253, and may generate a final count value by dividing the summed value by '2.' The effect of the second offset Voff2 may be offset by the final count value. The up-down counter 250 may output a final count value through the multiplexer 254, and the plurality of DACs 260 and 270 may output a reference voltage Vref and compensation voltages VCP and VCN, based on the final count value.

According to an example embodiment, when the receiver 200 performs offset compensation of the differential signals VSP and VSN, the effect of the second offset of the boundary detector 220 may be removed. Accordingly, the noise margin of the differential signals VSP and VSN may be further improved.

On the other hand, in FIGS. 1, 2A to 2D, 3 to 5, 6A, 6B, 7A, 7B, 8A to 8C, 9, and 10A to 10C, the present inventive concept has been described taking the case in which the differential signal has two levels as an example, but the present inventive concept is not limited thereto. For example, the receiver according to an example embodiment may also perform offset compensation of the differential signal in the case in which the differential signal is a signal having three or more levels, such as phase-amplitude modulation-3 (PAM-3) and PAM-4.

Hereinafter, an offset compensation method of a differential signal generator according to example embodiments will be described with reference to FIGS. 11A to 11C.

Figure 11A:
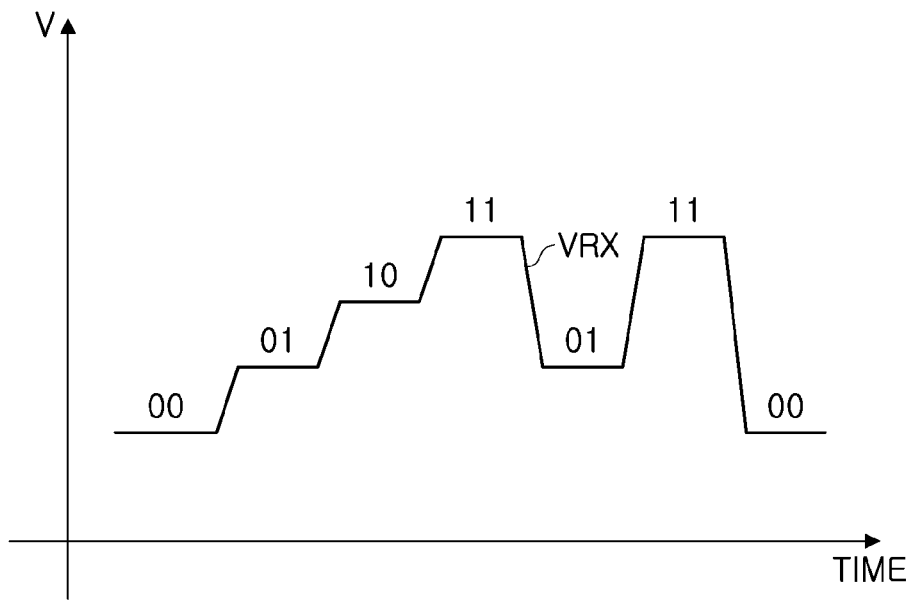
FIGS. 11A to 11C are diagrams illustrating an offset compensation method of a differential signal generator according to example embodiments.

FIG. 11A is a graph illustrating a signal level of a single-ended signal VRX over time. In the example of FIG. 11A, the single-ended signal VRX may be a PAM-4 signal having four signal levels. For example, each of the four signal levels may be mapped to one of '00', '01', '10', and '11'. The single-ended signal VRX may have any one of the four signal levels '00', '01', '10', and '11' in one period. For example, the single-ended signal VRX may transmit a signal of two bits in one period.

For example, when the single-ended signal VRX is a PAM-4 signal, the differential signals VSP and VSN may also be generated based on the single-ended signal VRX and the reference signal Vref.

Figure 11B:
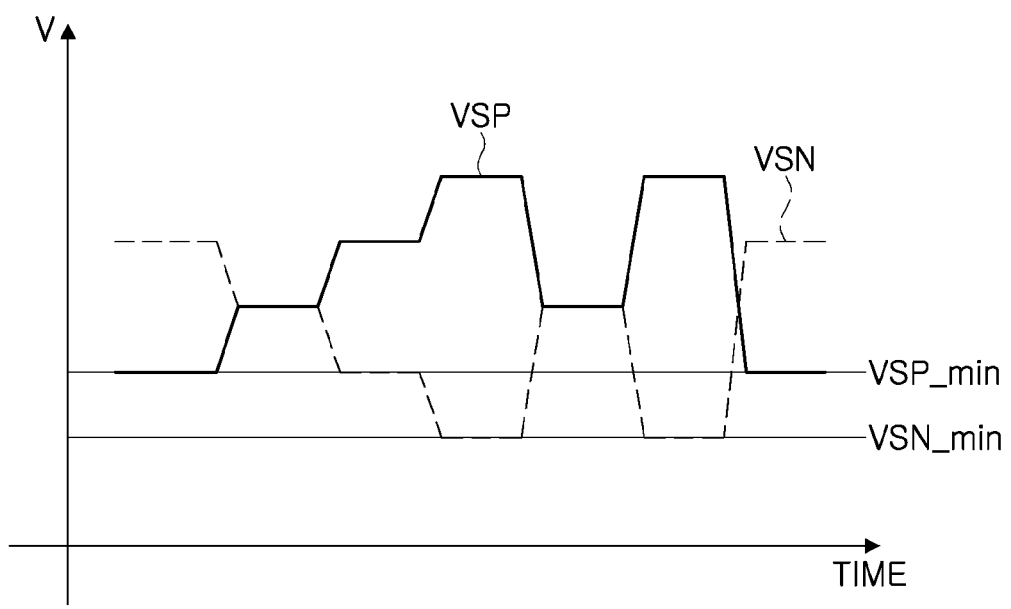

FIG. 11B is a graph illustrating signal levels of differential signals VSP and VSN having an offset, over time. As described with reference to FIG. 2C, when there is an offset in the differential signal generator, an offset voltage may be generated in the differential signals VSP and VSN. In the example of FIG. 11B, the DC level of the positive signal VSP may be higher than the DC level of the negative signal VSN, and the differential signals VSP and VSN may have a positive offset voltage.

Even in the case of the differential signals VSP and VSN having three or more levels, the polarity of the offset voltage of the differential signals VSP and VSN may be determined based on a difference value between minimum levels VSP_min and VSN_min of the differential signals. According to an example embodiment, the receiver may determine whether the differential signals VSP and VSN have a positive offset voltage or a negative offset voltage using a boundary detector as described in FIGS. 4 and 5. The receiver increases or decreases the count value of the counter according to whether the differential signals VSP and VSN have a positive offset voltage or a negative offset voltage, thereby adjusting the levels of the reference voltage Vref and the compensation voltages VCP and VCN.

Figure 11C:
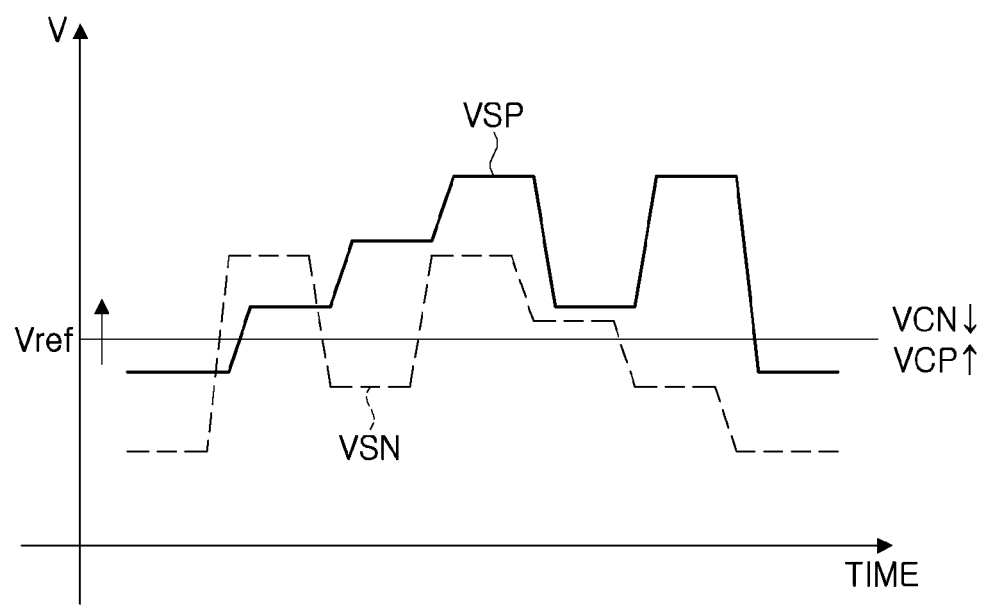

FIG. 11C is a graph illustrating levels of a reference voltage Vref and compensation voltages VCP and VCN for compensating for an offset of a differential signal generator. When the differential signals VSP and VSN have a positive offset voltage, the offset voltage difference may be reduced by increasing the level of the reference voltage Vref. Alternatively, the offset voltage difference may be reduced by increasing the level of the positive compensation signal VCP and decreasing the level of the negative compensation signal VCN.

FIGS. 12 and 13A to 13C are diagrams illustrating the effect of offset compensation according to example embodiments.

Figure 12:
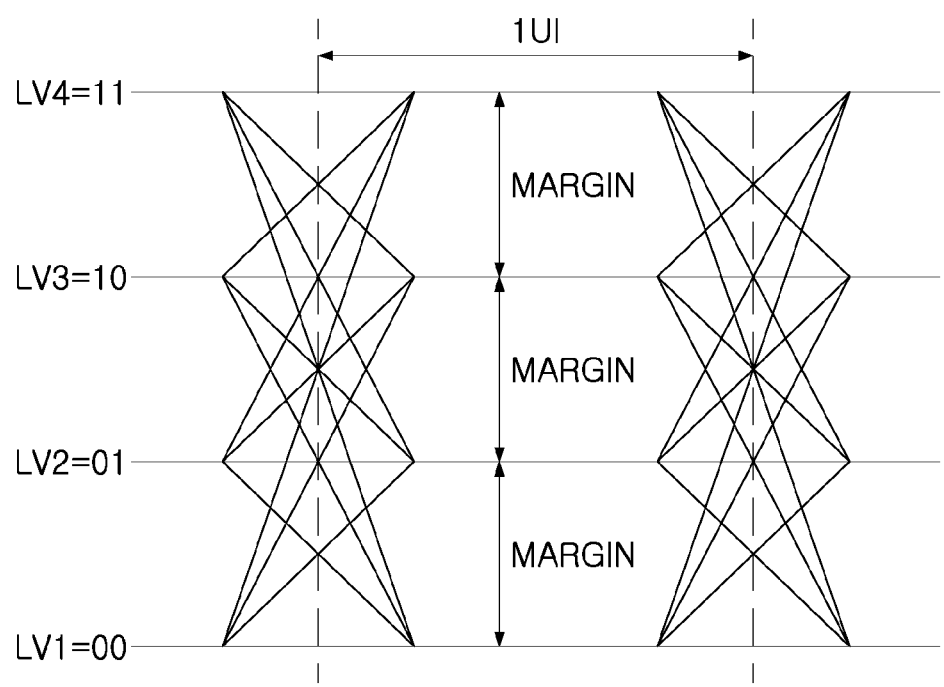
FIGS. 12 and 13A to 13C are diagrams illustrating the effect of offset compensation according to example embodiments.

FIG. 12 illustrates an eye diagram of a PAM-4 signal. Referring to FIG. 12, the PAM-4 signal may have any one of four signal levels LV1-LV4 in one signal period or one unit interval (1UI). Which level the PAM-4 signal has in one signal period 1UI may be determined by comparing the signal in the corresponding signal period with the reference voltages Vref1, Vref2, and Vref3. As the margin between adjacent signal levels increases and the margins are constant, the signal and the reference voltages Vref1, Vref2, and Vref3 may be more accurately distinguished. A degree to which margins between adjacent signal levels are even may be referred to as Ratio of Level Separation Mismatch (RLM). For example, when the single-ended signal VRX is the PAM-4 signal, RLM=1 indicates that three eyes are equally spaced and RLM=0 indicates that at least one of the three eyes has collapsed.

Figure 13A:
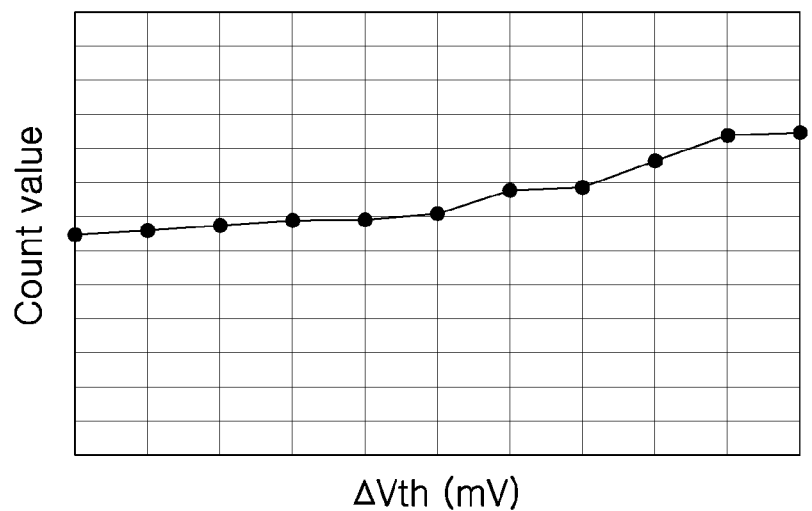
Figure 13B:
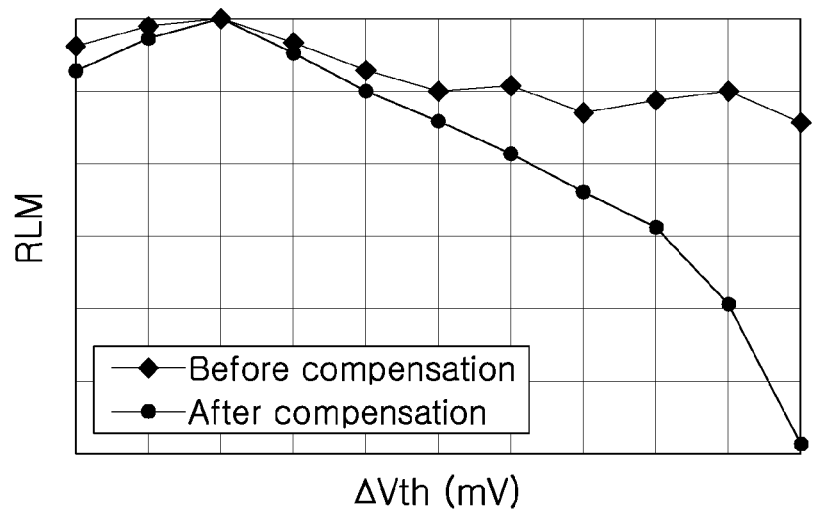
Figure 13C:
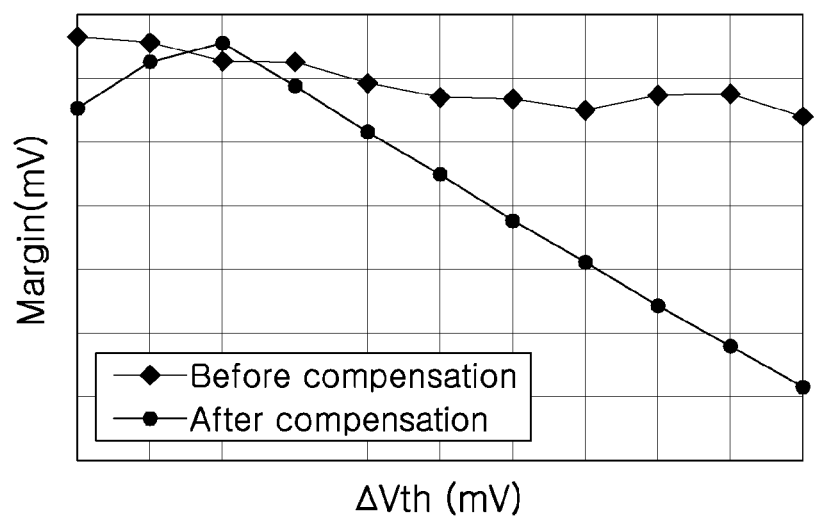

FIGS. 13A to 13C are simulation data illustrating an effect of offset compensation according to an example embodiment.

FIG. 13A illustrates a count value determined by an up/down counter according to an offset value $\Delta Vth$ of a differential signal generator. In FIG. 13A, a positive offset value may generate a positive offset voltage in the differential signals VSP and VSN, and a negative offset value may generate a negative offset voltage in the differential signals VSP and VSN.

In the example of FIG. 13A, the count value may be increased according to the offset value $\Delta Vth$ of the differential signal generator. For example, as the offset value $\Delta Vth$ has a greater value in the positive direction, the reference voltage Vref and the negative compensation voltage VCN are adjusted to increase, and the positive compensation voltage VCP is adjusted to decrease, and therefore, the offset of the differential signals VSP and VSN may be compensated for.

FIG. 13B illustrates an RLM before and after offset compensation according to an offset value ΔVth of a differential signal generator according to an example embodiment.

The RLM before offset compensation has a maximum value when the offset value ΔVth has a specific value O1, and when the offset value ΔVth deviates from the specific value O1, the RLM may be significantly reduced. On the other hand, according to an example embodiment of the present inventive concept, since the reference voltage Vref and the compensation voltages VCN and VCP may be adjusted according to the offset value, the RLM after offset compensation may be maintained in a high state regardless of the offset value ΔVth of the differential signal generator.

FIG. 13C illustrates a margin before and after offset compensation according to an example embodiment, according to an offset value ΔVth of a differential signal generator.

The margin before offset compensation has a maximum value when the offset value ΔVth has a specific value O2, and when the offset value ΔVth deviates from the specific value O2, the margin may be significantly reduced. On the other hand, since the reference voltage Vref and the compensation voltages VCN and VCP may be adjusted according to the offset value, the margin after offset compensation may be maintained in a high state regardless of the offset value ΔVth of the differential signal generator.

In detail, according to an example embodiment, the offset voltages of the differential signals VSP and VSN may be effectively reduced regardless of the offset value of the differential signal generator. For example, the offset of the differential signal generator may be compensated, and the margin and RLM of the receiver may be improved.

As set forth above, the receiver according to an example embodiment detects an offset voltage of a differential signal by comparing boundary levels of the differential signal, and adjusts a reference signal for generation of a differential signal based on the detected offset voltage, thereby compensating for the offset of the differential signal generator.

The receiver according to an example embodiment may improve the RLM and the margin in the eye diagram of the differential signal by reducing the magnitude of the offset voltage of the differential signal.

The offset voltage detection circuit included in the receiver according to an example embodiment generates boundary signals of a differential signal based on the received differential signal, and detects the offset voltage of the differential signal according to a comparison result of the boundary signals, thereby reducing power consumption for detection of an offset voltage.

While example embodiments have been illustrated and described above, it will be apparent to those skilled in the art that modifications and variations could be made without departing from the scope of the present inventive concept as defined by the appended claims.

What is claimed is:

1. A receiver comprising:
a differential signal generator configured to receive a single-ended signal, and generate differential signals having a positive signal and a negative signal complementary to the positive signal based on the single-ended signal, a reference signal, and a pair of compensation signals;
a positive charging circuit configured to charge a first node to a power level in a logic low period of a clock signal;
a negative charging circuit configured to charge a second node to the power level in the logic low period of the clock signal;
a positive discharging circuit configured to discharge the first node according to a signal level of the positive signal in a logic high period of the clock signal;
a negative discharging circuit configured to discharge the second node according to a signal level of the negative signal in the logic high period of the clock signal;
a comparator configured to compare a signal level of the first node and a signal level of the second node and output an offset detection signal of the differential signals in response to a result of the comparison; and
an offset compensator configured to output the reference signal and the pair of compensation signals, each adjusted based on the offset detection signal obtained from the comparator, to the differential signal generator.

2. The receiver of claim 1, wherein the comparator is configured to output a plurality of offset detection signals by comparing the signal level of the first node and the signal level of the second node a plurality of times, in the logic low period.

3. The receiver of claim 1, wherein the comparator is configured to output the offset detection signal indicating a positive offset voltage when the signal level of the first node is higher than the signal level of the second node.

4. The receiver of claim 1, wherein a length of the logic low period of the clock signal is greater than a length of a signal period of the differential signals.

5. The receiver of claim 4, wherein the positive discharging circuit is configured to discharge the first node over a plurality of signal periods of the differential signals having one of two or more levels in one signal period, in the logic low period of the clock signal,
wherein the negative discharging circuit is configured to discharge the second node over the plurality of signal periods of the differential signals, in the logic low period of the clock signal, and
wherein a difference between the signal levels of the first node and the second node on which the discharge is finished corresponds to a difference between the signal levels between the positive signal and the negative signal.

6. The receiver of claim 1, wherein the positive charging circuit includes:
a first transistor in which a gate is connected to the clock signal, a source is connected to a power signal, and a drain is connected to the first node.

7. The receiver of claim 6, wherein the positive discharging circuit includes:
a second transistor having a gate connected to the clock signal and a source connected to a ground; and
a third transistor having a gate connected to the positive signal and a source connected to the first node,
wherein drains of the second transistor and the third transistor are connected to each other.

8. The receiver of claim 7, wherein the second transistor is turned on when the clock signal is in a logic high state, and
wherein the third transistor is turned on when a level of the positive signal is lower than a difference between the signal level of the first node and a threshold level of the third transistor.

9. The receiver of claim 8, wherein the negative charging circuit includes:

a fourth transistor having a gate connected to the clock signal, a source connected to the power signal, and a drain connected to the second node, wherein the negative discharging circuit includes:

a fifth transistor having a gate connected to the clock signal and a source connected to the ground; and a sixth transistor having a gate connected to the negative signal, and a source connected to the second node, and wherein drains of the fifth transistor and the sixth transistor are connected to each other.

10. A receiver comprising:

a differential signal generator configured to receive a single-ended signal, and generate differential signals based on the single-ended signal, a reference signal, and a pair of compensation signals;

a boundary detector configured to:

receive a power signal, charge first and second nodes of the boundary detector in a charging period, in a discharging period after the charging period, discharge the first node according to a level of a positive signal among the differential signals and the second node according to a level of a negative signal among the differential signals, output a signal of the first node as a positive boundary signal, and output a signal of the second node as a negative boundary signal;

a comparator configured to generate a plurality of offset detection signals by comparing a level of the positive boundary signal and a level of the negative boundary signal a plurality of times within the discharging period;

a voting unit configured to output a final offset signal representing the discharging period, using the plurality of offset detection signals obtained from the comparator;

an up-down counter configured to increment or decrement a count value based on the final offset signal; and one or more digital-analog converters (DACs) configured to output the reference signal and the pair of compensation signals adjusted based on the count value.

11. The receiver of claim 10, wherein the one or more DACs includes:

an upper-bit DAC configured to output the reference signal; and a lower-bit DAC configured to output the pair of compensation signals.

12. The receiver of claim 11, wherein the count value has M bit values, where M is a natural number, and wherein among the M-bit values, an upper K (K is a natural number) bit value is input to the upper-bit DAC to determine the reference signal, and a lower (M−K) bit value is input to the lower-bit DAC to determine the pair of compensation signals.

13. The receiver of claim 12, wherein a level of the reference signal increases by a first unit level whenever the K-bit value increases, and wherein a level of a positive compensation signal among the pair of compensation signals decreases by a second unit level whenever the (M−K) bit value increases, and a level of a negative compensation signal among the pair of compensation signals increases by the second unit level whenever the (M−K) bit value increases.

14. The receiver of claim 13, wherein the first unit level has a greater value than the second unit level, and is lower than $2^{(M-K)}$ times the second unit level.

15. The receiver of claim 10, wherein the up-down counter is configured to determine:

a first count value by increasing or decreasing a count value according to final offset signals output in an untwisted state of an input terminal and an output terminal of the boundary detector, a second count value by increasing or decreasing a count value according to final offset signals output in a twisted state of the input terminal and the output terminal of the boundary detector, and the count value based on the first count value and the second count value.

16. The receiver of claim 10, wherein the differential signal generator includes:

a single ended to differential (S2D) converter configured to output a main signal having the same phase as the single-ended signal, and an inverted signal obtained by inverting a phase of the main signal with respect to the reference signal;

a differential amplifier configured to amplify the main signal and the inverted signal;

a Decision Feedback Equalizer (DFE) configured to remove an influence of Inter-Symbol Interference (ISI) expected from values of previous data of the amplified main signal and the amplified inverted signal, from current data; and a differential compensator configured to generate the differential signals by applying the pair of compensation signals to the main signal and the inverted signal from which the influence of the ISI has been removed.

17. The receiver of claim 10, wherein a length of the discharging period is longer than a signal period of the differential signals.

18. A receiver comprising:

a differential signal generator configured to receive a single-ended signal, and generate differential signals based on the single-ended signal, a reference signal, and a pair of compensation signals;

a boundary detector periodically configured to:

charge first and second nodes and discharge the charged first and second nodes based on a clock signal and the differential signals, and output boundary signals corresponding to a minimum level of the differential signals;

a comparator configured to generate offset detection signals by comparing levels of the boundary signals;

a voting unit configured to determine an offset polarity of the differential signals using the offset detection signals obtained from the comparator and output a final offset signal;

an up-down counter configured to:

determine a first count value by increasing or decreasing a count value according to final offset signals output in an untwisted state of an input terminal and an output terminal of the boundary detector, determine a second count value by increasing or decreasing a count value according to final offset signals output in a twisted state of the input and output terminals of the boundary detector, and output a final count value in which an influence of offset of the boundary detector has been canceled based on the first count value and the second count value; and one or more digital-analog converters (DACs) configured to output the reference signal and the pair of compensation signals adjusted based on the final count value.

19. The receiver of claim 18, wherein in the untwisted state:

a positive signal included in the differential signals is input to a first terminal of the input terminal of the boundary detector, a negative signal, which is a complementary signal of the positive signal, is input to a second terminal of the input terminal, a positive boundary signal among the boundary signals is input to a first terminal of the output terminal of the boundary detector, and a negative boundary signal among the boundary signals is input to a second terminal of the output terminal, and wherein in the twisted state:

the negative signal is input to the first terminal of the input terminal of the boundary detector, the positive signal is input to the second terminal of the input terminal, the negative boundary signal is input to the first terminal of the output terminal of the boundary detector, and the positive boundary signal is input to the second terminal of the output terminal.

20. The receiver of claim 18, wherein the up-down counter is configured to:

sum the first count value and the second count value, divide a summed value by '2', and output the final count value.

\* \* \* \* \*